United States Patent
Campbell et al.

(10) Patent No.: US 9,504,188 B1
(45) Date of Patent: Nov. 22, 2016

(54) AIR-MOVING ASSEMBLY WITH AUXILIARY TURBINE DRIVE

(71) Applicant: INTERNATIONAL BUSINESS MACHINES CORPORATION, Armonk, NY (US)

(72) Inventors: Levi A. Campbell, Poughkeepsie, NY (US); Milnes P. David, Fishkill, NY (US); Dustin W. Demetriou, Poughkeepsie, NY (US); Michael J. Domitrovits, New Paltz, NY (US); Michael J. Ellsworth, Jr., Poughkeepsie, NY (US); John V. Palmer, Central Valley, NY (US); Sal M. Rosato, Pine Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/953,634

(22) Filed: Nov. 30, 2015

(51) Int. Cl.
*H05K 7/20* (2006.01)
*H02P 29/02* (2016.01)
*F16D 43/00* (2006.01)

(52) U.S. Cl.
CPC .......... *H05K 7/20727* (2013.01); *F16D 43/00* (2013.01); *H02P 29/025* (2013.01)

(58) Field of Classification Search
CPC .......... H05K 7/20136; H05K 7/2059; H05K 7/20654; H05K 7/20745; H05K 7/2079
See application file for complete search history.

(56) References Cited

U.S. PATENT DOCUMENTS

| 2,826,096 A | * | 3/1958 | Hoge | F16H 1/20 192/45.01 |
| 3,236,122 A | | 2/1966 | Biernson | |

(Continued)

FOREIGN PATENT DOCUMENTS

| CN | 2012-41864 Y | 5/2009 |
| CN | 102967159 A | 3/2013 |

(Continued)

OTHER PUBLICATIONS

David et al., Office Action for U.S. Appl. No. 14/494,924, filed Sep. 24, 2014, dated Mar. 3, 2016 (17 pages).

(Continued)

*Primary Examiner* — Robert J Hoffberg
(74) *Attorney, Agent, or Firm* — Steven Chiu, Esq.; Kevin P. Radigan, Esq.; Heslin Rothenberg Farley & Mesiti P.C.

(57) ABSTRACT

Apparatuses and methods are provided for facilitating air-cooling of, for instance, one or more electronics racks within a data center. The apparatus includes an air-moving assembly and an auxiliary turbine drive. The air-moving assembly includes a shaft, one or more mechanical fans coupled to the shaft to rotate, at least in part, with the shaft, and a motor coupled to the shaft to rotatably drive the shaft. The auxiliary turbine drive is coupled to the shaft of the air-moving assembly to provide backup rotational energy to the shaft to facilitate continued rotation of the shaft during interruption in power to the motor. In one implementation, the auxiliary turbine drive is configured to facilitate, for a specified time period, continued rotation of the shaft at a specified percentage, or greater, rotational speed of the shaft compared with a shaft speed when rotatably driven by the motor.

20 Claims, 16 Drawing Sheets

(56) References Cited

U.S. PATENT DOCUMENTS

| | | | |
|---|---|---|---|
| 4,086,781 A | 5/1978 | Brody et al. | |
| 4,339,779 A | 7/1982 | Kalbach et al. | |
| 6,255,743 B1 | 7/2001 | Pinkerton et al. | |
| 6,573,626 B1 | 6/2003 | Gosebruch et al. | |
| 6,574,963 B1* | 6/2003 | Tadayon | F03G 7/00 60/651 |
| 6,657,320 B1 | 12/2003 | Andrews et al. | |
| 6,702,661 B1* | 3/2004 | Clifton | H05K 7/20145 361/695 |
| 7,127,895 B2* | 10/2006 | Pinkerton | F02C 6/16 60/646 |
| 7,177,151 B2* | 2/2007 | Van Lear | F04D 25/04 165/104.33 |
| 7,200,005 B2* | 4/2007 | Von Gutfeld | G06F 1/20 290/55 |
| 7,274,566 B2* | 9/2007 | Campbell | H05K 7/2079 165/80.4 |
| 7,462,954 B2 | 12/2008 | Kraus | |
| 7,681,395 B2* | 3/2010 | Pinkerton | F02C 6/16 60/646 |
| 7,750,518 B1 | 7/2010 | Perkins | |
| 7,878,007 B2 | 2/2011 | Campbell et al. | |
| 8,360,931 B2* | 1/2013 | Keeney | B60K 17/28 180/165 |
| 8,544,575 B1 | 10/2013 | Scaringe et al. | |
| 8,671,686 B2* | 3/2014 | Pinkerton | G06F 1/30 60/646 |
| 8,941,256 B1* | 1/2015 | Czamara | F03D 9/00 290/55 |
| 9,045,995 B2 | 6/2015 | Graybill et al. | |
| 9,141,155 B2* | 9/2015 | Wiley | G06F 1/20 |
| 9,144,181 B2* | 9/2015 | Wiley | H05K 7/20745 |
| 2006/0059936 A1* | 3/2006 | Radke | H02K 11/048 62/259.2 |
| 2007/0139883 A1* | 6/2007 | Pinkerton | H01L 23/473 361/696 |
| 2011/0215645 A1 | 9/2011 | Schomburg et al. | |
| 2012/0309284 A1* | 12/2012 | Dernis | F24F 11/0001 454/184 |
| 2013/0049473 A1 | 2/2013 | Brech et al. | |
| 2014/0039852 A1 | 2/2014 | Zhang et al. | |
| 2016/0084257 A1* | 3/2016 | David | F04D 25/166 361/679.47 |
| 2016/0088764 A1* | 3/2016 | David | F04D 25/166 361/679.48 |

FOREIGN PATENT DOCUMENTS

| | | |
|---|---|---|
| CN | 203443046 U | 2/2014 |
| CN | 203550654 U | 4/2014 |
| CN | 20461224 U | 12/2014 |
| CN | 20432665 U | 5/2015 |
| CN | 204451130 U | 7/2015 |
| JP | H07120592 A | 5/1995 |
| KR | 10-2008-0007943 A | 1/2008 |
| WO | WO2014/079127 A1 | 5/2014 |

OTHER PUBLICATIONS

David et al., "Air-Moving Assemblies with Flywheels", U.S. Appl. No. 14/494,924, filed Sep. 24, 2014 (41 pages).

David et al., "Air-Moving Assemblies with Flywheels", U.S. Appl. No. 14/828,745, filed Aug. 18, 2015 (37 pages).

Campbell et al., "List of IBM Patent or Patent Applications Treated as Related", U.S. Appl. No. 14/953,634, filed Nov. 30, 2015 (2 pages).

* cited by examiner

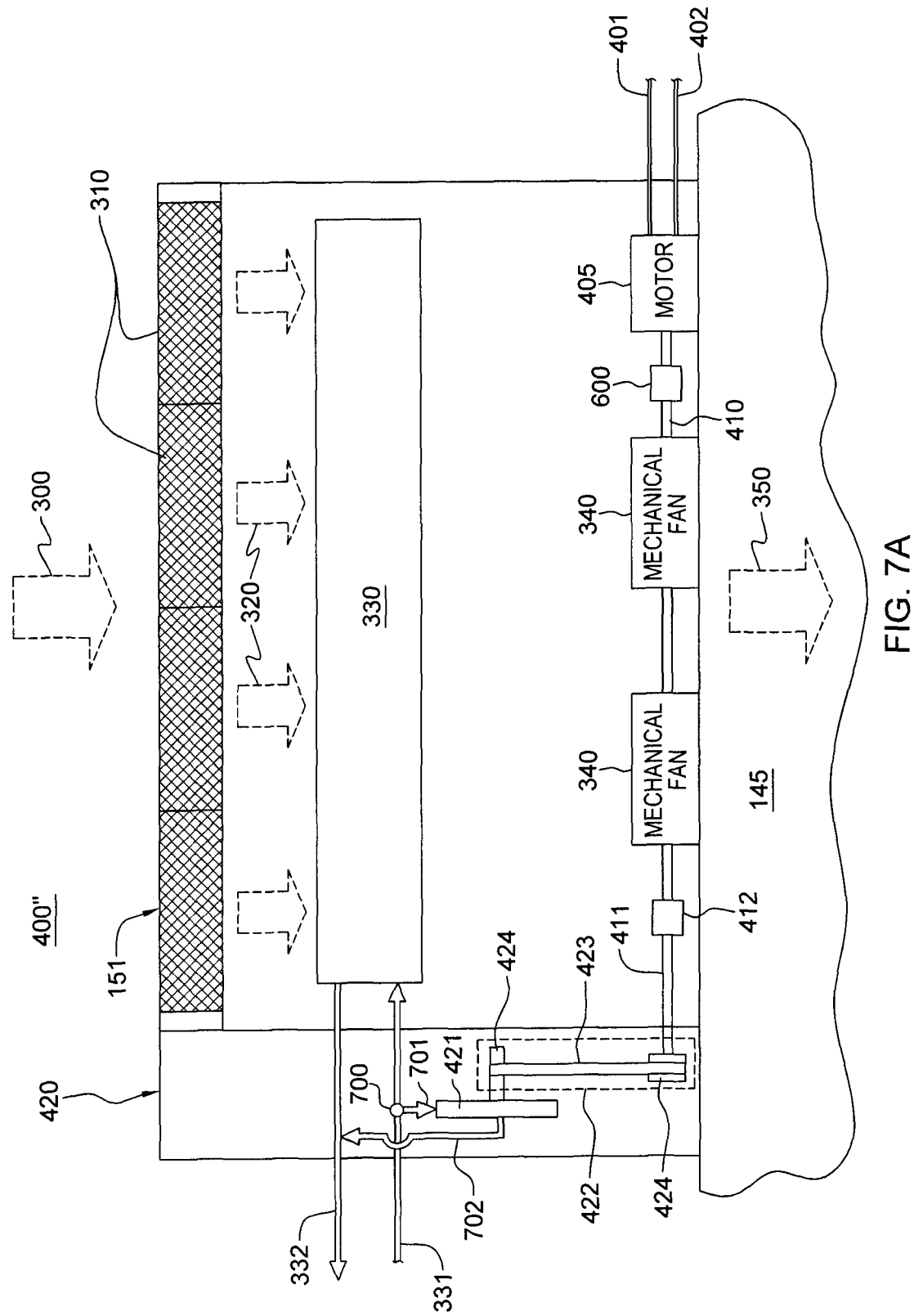

AIR-MOVING ASSEMBLY WITH AUXILIARY TURBINE DRIVE

BACKGROUND

In many server applications, processors, along with their associated electronics (e.g., memory, disk drives, power supplies, etc.), are packaged in removable drawer or subsystem configurations stacked within an electronics rack or frame comprising information technology (IT) equipment. In other cases, the electronics may be in fixed locations within the rack or frame. As circuit densities continue to increase at all levels of packaging, there is an ever-growing need for providing continuous cooling to the electronics rack(s), including the electronic subsystems thereof. As one solution, cooling apparatuses may be provided which include one or more air-moving assemblies (e.g., axial fans, centrifugal fans) which facilitate moving airflow through the electronics racks, typically front-to-back. These fans are in addition to the computer-room, air-moving assemblies, such as computer-room air-conditioner (CRAC) units or computer-room air-handler (CRAH) units, which provide air movement within the data center, and thus, cooling to the data center. To meet the ever-growing need for providing continuous cooling to the electronics racks of a data center, further air-handling enhancements are needed.

SUMMARY

The shortcomings of the prior art and additional advantages are provided through the provision, in one aspect, of an apparatus which includes an air-moving assembly and an auxiliary turbine drive. The air-moving assembly includes: a shaft, one or more mechanical fans coupled to the shaft to rotate, at least in part, with the shaft; and a motor coupled to the shaft to rotatably drive the shaft. The auxiliary turbine drive is associated with the air-moving assembly, and the auxiliary turbine drive coupling to the shaft of the air-moving assembly to provide backup rotational energy to the shaft to facilitate continued rotation of the shaft during interruption in power to the motor.

In another aspect, a data center is provided which includes at least one electronics rack to be cooled, an air-moving assembly, and an auxiliary turbine drive. The air-moving assembly facilitates, at least in part, air-cooling of the at least one electronics rack, and includes: a shaft; one or more mechanical fans coupled to the shaft to rotate, at least in part, with the shaft; and a motor coupled to the shaft to rotatably drive the shaft. The auxiliary turbine drive is associated with the air-moving assembly, coupling to the shaft of the air-moving assembly to provide backup rotational energy to the shaft to facilitate continued rotation of the shaft during interruption in power to the motor to provide continued air-cooling of the at least one electronics rack during the interruption in power to the motor.

In a further aspect, a method of facilitating cooling is provided which includes: providing an air-moving assembly, the air-moving assembly comprising: a shaft; one or more mechanical fans coupled to the shaft to rotate, at least in part, with the shaft; and a motor coupled to the shaft to rotatably drive the shaft; and providing an auxiliary turbine drive associated with the air-moving assembly, the auxiliary turbine drive coupling to the shaft of the air-moving assembly to provide backup rotational energy to the shaft to facilitate continued rotation of the shaft during interruption in power to the motor.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A is a schematic of a more detailed embodiment of an apparatus comprising an air-moving assembly and auxiliary turbine drive for, for instance, a data center, in accordance with one or more aspects of the present invention;

DETAILED DESCRIPTION

Figure 1:
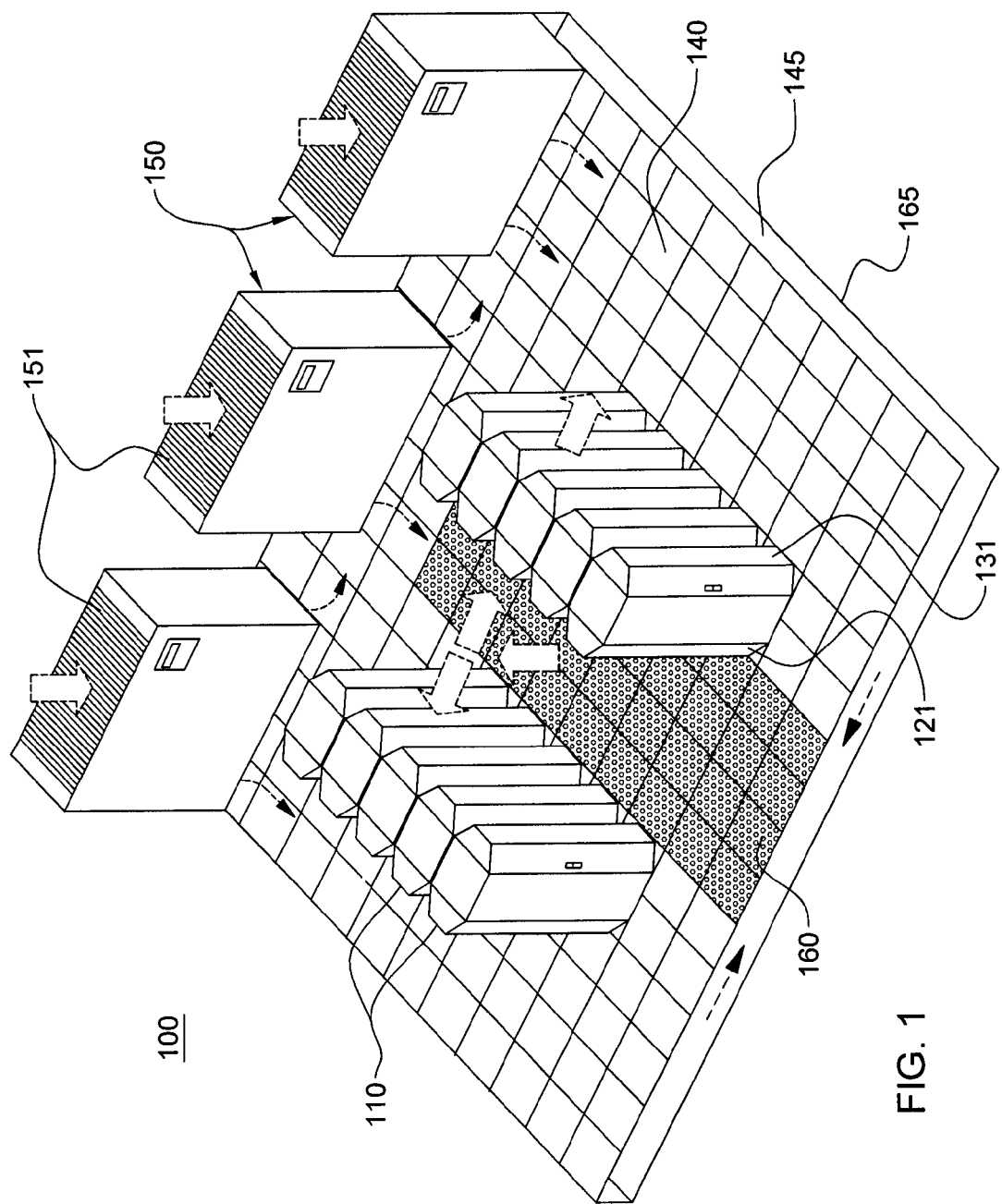
FIG. 1 depicts one embodiment of a data center or computer-room having a plurality of computer-room, air-moving assemblies, in accordance with one or more aspects of the present invention.

As used herein, the terms "electronics rack" and "rack unit" are used interchangeably, and unless otherwise specified include any housing, frame, rack, compartment, blade server system, etc., having one or more heat generating components of a computer system, electronic system, or information technology (IT) system, and may be, for example, a stand-alone computer processor having high, mid or low end processing capability. In one embodiment, an electronics rack may include one or more electronic systems or subsystems, each having one or more heat generating components requiring cooling. An electronic system or subsystem of an electronics rack may be movable or fixed relative to the electronics rack, with the electronics drawers of a multi-drawer rack unit and blades of a blade center system being two examples of systems or subsystems of an electronics rack to be cooled. In one specific example, "electronic subsystem" may refer to a part of an electronic system, and may be, in one example, a server node of a multi-server rack.

Also, "air-to-liquid heat exchanger" includes any heat exchange mechanism characterized as described herein through which a liquid coolant can circulate; and includes, one or more discrete air-to-liquid heat exchangers coupled either in series or in parallel. An air-to-liquid heat exchanger may include, for example, one or more coolant flow paths, formed of thermally conductive tubing (such as copper or other tubing) in thermal communication with a plurality of cooling fins. Size, configuration and construction of the air-to-coolant heat exchanger can vary without departing from the scope of the invention disclosed herein. Unless otherwise specified, "heat exchanger" is used herein to refer generally to an air-to-liquid heat exchanger. Further, "data center" refers to, for instance, a computer or information technology (IT) installation containing one or more electronic systems, electronics racks, etc., to be cooled. As a specific example, a data center may include one or more rows of rack-mounted computing units, such as server units.

As used herein, air flows "across" the heat exchanger and "coolant" flows "through" the heat exchanger. Flowing across the heat exchanger refers to air passing across the outside of the conductive tubing forming the one or more coolant flow paths, while flowing through the heat exchanger refers to the fluid passing through the heat exchanger's one or more coolant flow paths formed by the conductive tubing. Further, by way of example only, the air-moving assembly is described hereinbelow in certain implementations as a computer-room air-conditioner (CRAC) unit or computer-room air-handler (CRAH) unit.

One example of the liquid or coolant employed in an air-to-liquid heat exchanger is water. However, the concepts disclosed herein are readily adapted to use with other types of liquid coolant. For example, one or more of the coolants or liquids may comprise a brine, a fluorocarbon liquid, a liquid metal, or other similar coolant, or refrigerant, while still maintaining the advantages and unique features of the present invention.

Reference is made below to the drawings, where the same reference numbers used throughout different figures designate the same or similar components.

FIG. 1 depicts one embodiment of a raised floor, data center layout 100. In this layout, multiple electronics racks 110 are disposed in one or more rows. A computer installation such as depicted in FIG. 1 may house several hundred, or even several thousand, processors. In the arrangement of FIG. 1, cooled air enters the computer-room via floor vents from a supply air plenum 145 defined between the raised floor 140 and a base or sub-floor 165 of the room. Cooled air is taken in through air inlet sides 121 of the electronics racks 110 and expelled through air outlet sides 131 of the electronics racks. One or more electronics racks 110 may have one or more an air-moving devices (e.g., axial and/or centrifugal fans) to provide forced inlet-to-outlet airflow to cool the electronic components within the rack unit. The supply air plenum 145 provides, in one embodiment, cooled air to the air inlet sides of the electronics racks via perforated floor tiles 160 disposed in one or more "cold" aisles of the computer-room installation. The cooled air is supplied to plenum 145 by one or more computer-room, air-moving assemblies 150, also disposed within the data center 100. Room air is taken in through vents 151 into and cooled by computer-room, air-moving assemblies 150, and this room air comprises in part exhausted air from the "hot" aisles of the computer-room installation defined, for example, by opposing air outlet sides of electronics racks 110.

Figure 2:
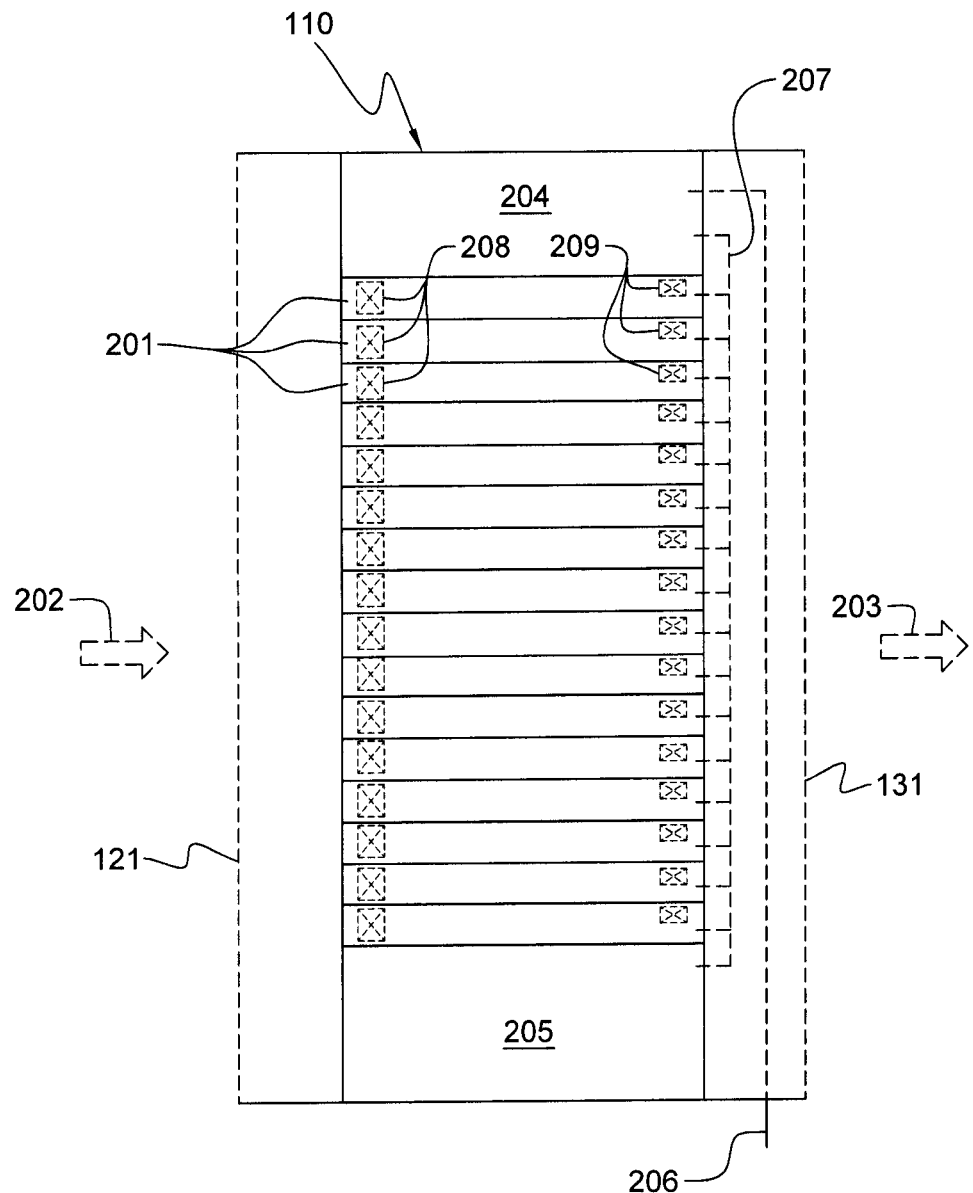
FIG. 2 is a cross-sectional elevational view of one embodiment of an electronics rack of the data center of FIG. 1 being air-cooled, in accordance with one or more aspects of the present invention.

FIG. 2 depicts (by way of example) one embodiment of an electronics rack 110 with a plurality of electronic subsystems 201 to be cooled. In the embodiment illustrated, electronic subsystems 201 are air-cooled by cool airflow 202 ingressing via air inlet side 121, and exhausting out air outlet side 131 as hot airflow 203. By way of example, one or more axial fan assemblies 208 may be provided at the air inlet sides of electronic subsystems 201 and/or one or more centrifugal fan assemblies 209 may be provided at the air outlet sides of electronic subsystems 201 to facilitate airflow through the individual subsystems 201 as part of the cooling apparatus of electronics rack 110. One or more of electronic subsystems 201 may include heat-generating components to be cooled of a computer system, electronics system, and/or information technology (IT) equipment. For example, one or more of the electronic subsystems 201 may include one or more processors and associated memory.

Electronics rack 110 may also include, by way of example, one or more bulk power assemblies 204 of an AC to DC power supply assembly. AC to DC power supply assembly further includes, in one embodiment, a frame controller, which may be resident in the bulk power assembly 204 and/or in one or more electronic subsystems 201. Also illustrated in FIG. 2 is one or more input/output (I/O) drawer(s) 205, which may also include a switch network. I/O drawer(s) 205 may include, as one example, PCI slots and disk drivers for the electronics rack.

In the depicted implementation, a three-phase AC source feeds power via an AC power supply line cord 206 to bulk power assembly 204, which transforms the supplied AC power to an appropriate DC power level for output via distribution cable 207 to the plurality of electronic subsystems 201 and I/O drawer(s) 205. The number of electronic subsystems installed in the electronics rack is variable, and depends on customer requirements for a particular system. Further, axial or centrifugal fan assemblies could alternatively, or also, reside within, for instance, bulk power assembly 204, or I/O drawer(s) 205. Again, the particular electronics rack 110 configuration of FIG. 2 is presented by way of example only, and not by way of limitation.

Figure 3:
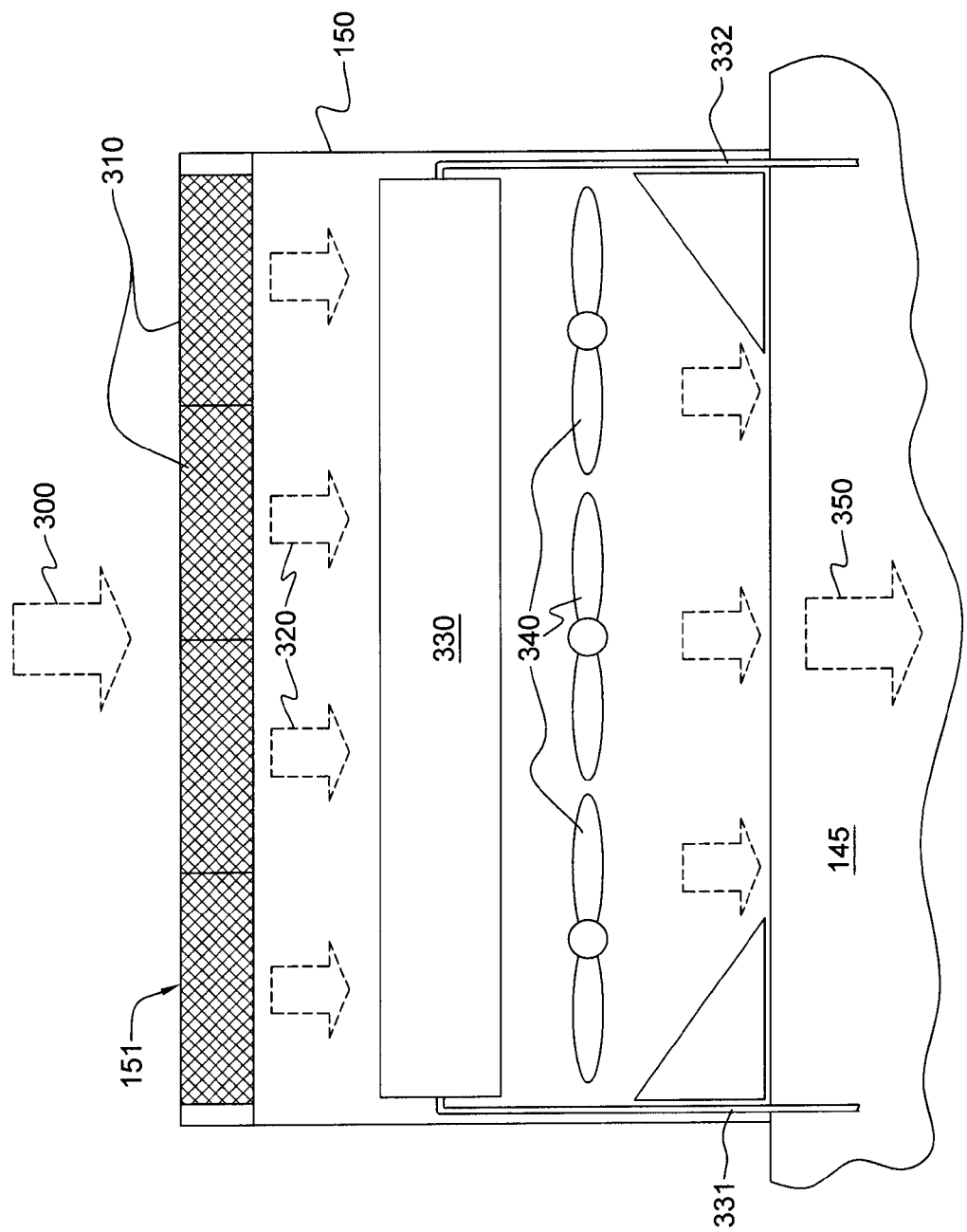
FIG. 3 is a cross-sectional elevational view of one embodiment of a computer-room, air-moving assembly for the data center of FIG. 1, which is to be modified in accordance with one or more aspects of the present invention.

By way of example only, FIG. 3 illustrates one embodiment of an air-moving assembly, or more specifically, a computer-room, air-moving assembly 150, which in this example, is a computer-room air-conditioner (CRAC) unit with a top to bottom airflow design, and which is configured to provide temperature-conditioned air for electronics rack cooling in a raised floor data center configuration, such as depicted in FIG. 1. As illustrated, warm computer-room air 300 enters the CRAC unit via an open vent 151 at an air inlet of the CRAC unit, and optionally flows through a set of air filters 310. After passing through air filters 310, the filtered warm air 320 is cooled as it passes across an air-to-coolant heat exchanger 330. Coolant is provided to air-to-coolant heat exchanger 330 via a coolant supply line 331 and coolant return line 332. The filtered, warm air 320 is drawn across air-to-coolant heat exchanger 330 via one or more mechanical fans 340 (e.g., axial or centrifugal fans) disposed, for instance, in the lower portion of computer-room, air-moving assembly 150. The cooled air 350 is pushed by mechanical fans 340 into space 145 under the raised floor to create the pressurized plenum needed to facilitate raised floor data center cooling via the perforated tiles discussed above with reference to FIG. 1. The air-to-coolant heat exchanger may be supplied (in one example) with sub-ambient chilled coolant from a refrigeration chiller. This chilled coolant absorbs heat from the warm air passing across the air-to-coolant heat exchanger, and rejects the heat to the refrigeration chiller plant (not shown).

In order to provide continuous operation of an electronics rack(s), the electronics rack(s) may be provided with an Uninterruptable Power Supply (UPS) system, which maintains operation of the electronic system(s) within the rack(s) in the event of a utility power disruption to the data center. When utility power is lost to a data center, the air-moving assemblies, such as computer-room air-conditioner (CRAC) units or computer-room air-handler (CRAH) units, typically lose power as well until the utility power is restored, or back-up generators become operational. Conventionally, it has been unnecessary to have the computer-room, air-moving assemblies on a UPS system, due to a relatively large cooling margin between the actual data center environmental operating conditions, and the point where the electronics rack(s), or more specifically the electronic system(s) or information technology (IT) equipment within the electronics rack(s), could overheat, automatically shut down, and possibly becoming damaged. With greater emphasis on energy efficiency within a data center, however, the allowable environmental operating temperatures have risen, thus reducing the amount of time that a data center cooling apparatus or system can be interrupted without negatively affecting the electronics.

As a solution, an Uninterruptable Power Supply (UPS) system could be installed for the one or more computer-room, air-moving assemblies within the data center. However, this would require significant initial capital investment, as well as generate significant ongoing maintenance expenses. Further, installing UPS systems for computer-room, air-moving assemblies on a typical data center floor could require a sizable amount of floor or building space, due to the system's relatively large size.

An alternative solution disclosed herein is to associate an auxiliary turbine drive with one or more air-moving assemblies to advantageously provide cooling or thermal ride-through in the event of a power interruption, at least until back-up generators are brought online to provide backup power to the air-moving assembly. As data centers migrate for energy efficiency reasons towards increasing rack inlet temperatures to the maximum allowable by ASHRAE TC 9.9, additional risk to achieving thermal ride-through if a utility power interruption arises in the data center. By adding an appropriately sized and coupled auxiliary turbine drive to an air-moving assembly, such as the above-noted CRAC units or CRAH units, enough energy can be provided for the mechanical fans within the air-moving assembly to continue, for instance, for a specified period of time, to rotate at least a pre-specified rotational speed, and provide continued air-cooling to the data center floor; that is, at least for a brief, specified time or interval, until emergency, backup power or normal utility power is anticipated to become available and the air-moving assemblies can resume operation. Note in this regard that, in the event of a utility power interruption, cool air continues to remain in the cool air plenum, and the air-to-coolant heat exchangers continue to cool any air passing through the air-moving assembly.

Using an auxiliary turbine drive as disclosed herein provides additional cooling time to the data center floor in the event of a utility power interruption to the air-moving assembly, and may be used alternatively or in combination with a UPS system. Advantageously though, the turbine drive solutions disclosed herein are more cost effective, they may be purchased incrementally with the data center cooling units, require less maintenance, and eliminate battery concerns compared to providing one or more UPS systems for cooling ride-through within the data center in the event of a utility power interruption, at least for a relatively brief time period, for instance, sufficient for backup generator power to come online.

As noted, in many mission-critical data centers, air-moving assemblies of the data center are not on an Uninterruptable Power Supply (UPS) system. Thus, during a power outage, the air-moving assemblies (such as CRAC/CRAH units) lose power for the duration of time it takes for, for instance, the data center generators to start up and provide backup power to the equipment. Depending upon how the data center is prioritized, this could take, for instance, 60-90 seconds, or longer, before the air-moving assemblies are supplied with back-up power. Since most information technology (IT) equipment is on a UPS system, the heat being produced within the data center by this equipment continues to dissipate into the room at the same or greater rate than it did prior to the power interruption. By adding or associating an appropriately-sized auxiliary turbine drive to the one or more air-moving assemblies of the data center, the effect of the power disturbance to the electronics rack(s), and more particularly, the IT equipment within the rack(s), can be minimized. The turbine drive can be configured, sized and coupled to provide enough rotational energy to keep the mechanical fans of the air-moving assembly rotating for a specific amount of time at a specified rotational speed (or greater), providing continued airflow within the data center to cool the electronics racks.

Generally stated, disclosed herein are apparatuses, data centers, and methods which incorporate or associate an auxiliary turbine drive with an air-moving assembly, such as a computer-room, air-moving assembly. The apparatus may include, in certain implementations, an air-moving assembly, which may comprise a shaft; one or more mechanical fans coupled to the shaft to rotate, at least in part, with the shaft; and a motor coupled to the shaft to rotatably drive the shaft. By way of example, the one or more mechanical fans may comprise one or more axial fans and/or one or more centrifugal fans. The auxiliary (or backup) turbine drive couples to the shaft of the air-moving assembly to provide rotational energy to the shaft to facilitate, for (for instance) a specified period of time, continued rotation of the shaft during interruption in power to the motor. Note that although described herein as being associated with an air-moving assembly, the auxiliary turbine drive could be associated with multiple air-moving assemblies, for instance, by provision of multiple turbines, each coupled to a respective air-moving assembly of multiple air-moving assemblies (such as CRAC/CRAH units), with the auxiliary turbine drive configured to concurrently, through the respective turbines, provide backup rotational energy to the respective shafts of the air-moving assemblies to facilitate continued rotation of the shafts during interruption in power to the respective motors. Thus, those skilled in the art will understand from the following description that, although described as being associated with an air-moving assembly, the auxiliary turbine drive may be associated with one or more air-moving assemblies to provide the backup rotational energy described herein.

In certain implementations, the auxiliary turbine drive is sized and selectively coupled to the shaft of the air-moving assembly to facilitate, for the specified period of time, continued rotation of the shaft at a specified percentage, or greater, rotational speed of the shaft compared with a rotational speed of the shaft when rotatably driven by the motor. For instance, the specified period of time may be an anticipated amount of time from the utility power interruption to the motor within which motor power can be reestablished within the data center, either by utility power coming back online, or for instance, by backup power generation becoming available.

Advantageously, the air-moving assembly of the apparatus may include or be a computer-room, air-moving assembly providing, at least in part, air movement within a data center having one or more electronics racks to be cooled. For instance, the air-moving assembly may be, in certain embodiments, a computer-room air-conditioner (CRAC) unit, or a computer-room air-handler (CRAH) unit. In one or more other embodiments, the air-moving assembly may be associated with a room or housing containing one or more heat-generating components to be cooled. For instance, the air-moving assembly may be associated with a room containing one or more UPS systems for a data center.

In one or more implementations, it may be advantageous to couple a turbine of the turbine drive to the shaft through a shaft extender and a turbine coupling mechanism, such as a clutch coupling the shaft-extender to the shaft during the interruption in power to the motor. The turbine coupling mechanism, or more particularly, the clutch, may comprise any of a variety of mechanical or electromechanical clutch mechanisms which automatically couple the shaft extender, and its associated turbine, to the shaft, responsive to interruption in power to the motor, detected, for instance, by a slow-down in rotation of the shaft.

In certain implementations, a drive belt assembly may couple the turbine to the shaft or the shaft extender. The drive belt assembly may include a gearing mechanism providing an increased rotational speed to the turbine in comparison to the rotational speed of the shaft. By way of example, the specified period of time may be achieved by the turbine drive being appropriately sized, and the increased rotational speed being selected, to achieve a set time period from a utility power interruption for the continued rotation of the shaft at a specified percentage, or greater, rotational speed of the shaft compared with a rotational speed of the shaft when rotatably driven by the motor in normal operation. For instance, in one implementation, it may be desirable for the specified period of time to be 60 or 90 seconds, and the specified percentage to be about 50%. That is, at 60 or 90 seconds after an interruption in utility power to the motor, causing operation of the motor to cease, the turbine drive rotates the shaft at least 50% of the rotational speed at which the shaft would be operating at under normal conditions, with the motor powered.

In one or more implementations, an electromotive force (emf) decoupling mechanism may be provided which automatically open circuits during an interruption in power to the motor, and prevents the continued rotation of the shaft during the interruption in power to the motor from providing a back electromotive force through the motor. In one implementation, the emf decoupling mechanism includes an electromagnetic switch which is electrically coupled to a circuit line provided to power the motor. The electromagnetic switch automatically switches to an open circuit state with loss of power to the motor through the circuit line. In certain other embodiments, a motor decoupling mechanism may be provided, which includes a clutch mechanism coupling the shaft to a drive shaft of the motor. The drive shaft drives rotation of the shaft when the motor is operating, and the clutch mechanism automatically decouples the shaft and the drive shaft responsive to the interruption in power to the motor. Various mechanical or electromechanical clutch mechanisms may be employed for this purpose, as described herein.

As noted, in one or more implementations, the air-moving assembly is a computer-room air-conditioner (CRAC) unit, and the CRAC unit includes an air-to-coolant heat exchanger, which provides cooled air to a data center. In this implementation, the turbine drive may be sized and coupled to provide, for the specified period of time, the continued rotation of the shaft to facilitate the computer-room air-conditioner unit providing additional cooled air to the data center during the interruption in power to the motor, wherein the turbine drive may be sized and coupled to the shaft to facilitate, for the specified period of time, the continued rotation of the shaft at a specified percentage, or greater, rotational speed of the shaft compared with the rotational speed of the shaft when rotatably driven by the motor.

In one or more embodiments, the turbine of the auxiliary turbine drive may be coupled in parallel fluid communication with an air-to-liquid heat exchanger of the air-moving assembly, for instance, across a coolant inlet and a coolant outlet of the air-to-liquid heat exchanger. In one or more embodiments, the turbine of the auxiliary turbine drive may be coupled to receive coolant from and/or return coolant to a coolant supply line or a coolant return line coupled in fluid communication with the air-moving assembly.

Additionally, in one or more implementations, the auxiliary turbine drive may include a liquid supply tank coupled to drive one or more turbines of the auxiliary turbine drive during the interruption and power to the motor. For example, the liquid supply tank may comprise a liquid supply tower which holds a liquid and, for instance, feeds the liquid in parallel to, for instance, an air-to-liquid heat exchanger associated with the air moving assembly, and to the turbine(s) of the auxiliary turbine drive during the interruption in power to the motor. The liquid supply tower is of sufficient height and capacity to provide a desired liquid flow, for instance, via gravity, from the supply tank or tower to the one or more turbines of the auxiliary turbine drive with, for instance, one turbine being associated with a respective air-moving assembly (such as a respective CRAC/CRAH unit of a data center). Additionally, a liquid exhaust tank may be coupled to receive liquid exhaust from, at least, the turbine(s) of the auxiliary turbine drive during the interruption of power to the motor, or from both the heat exchanger and the turbine(s). In one or more implementations, the liquid supply tank may include a pressurizer for selectively pressurizing the liquid supply tank, for instance, upon the interruption and power to the motor of the air-moving assembly to facilitate an increased flow of liquid from the liquid supply tank to, at least, the turbine of the auxiliary turbine drive.

Figure 4:
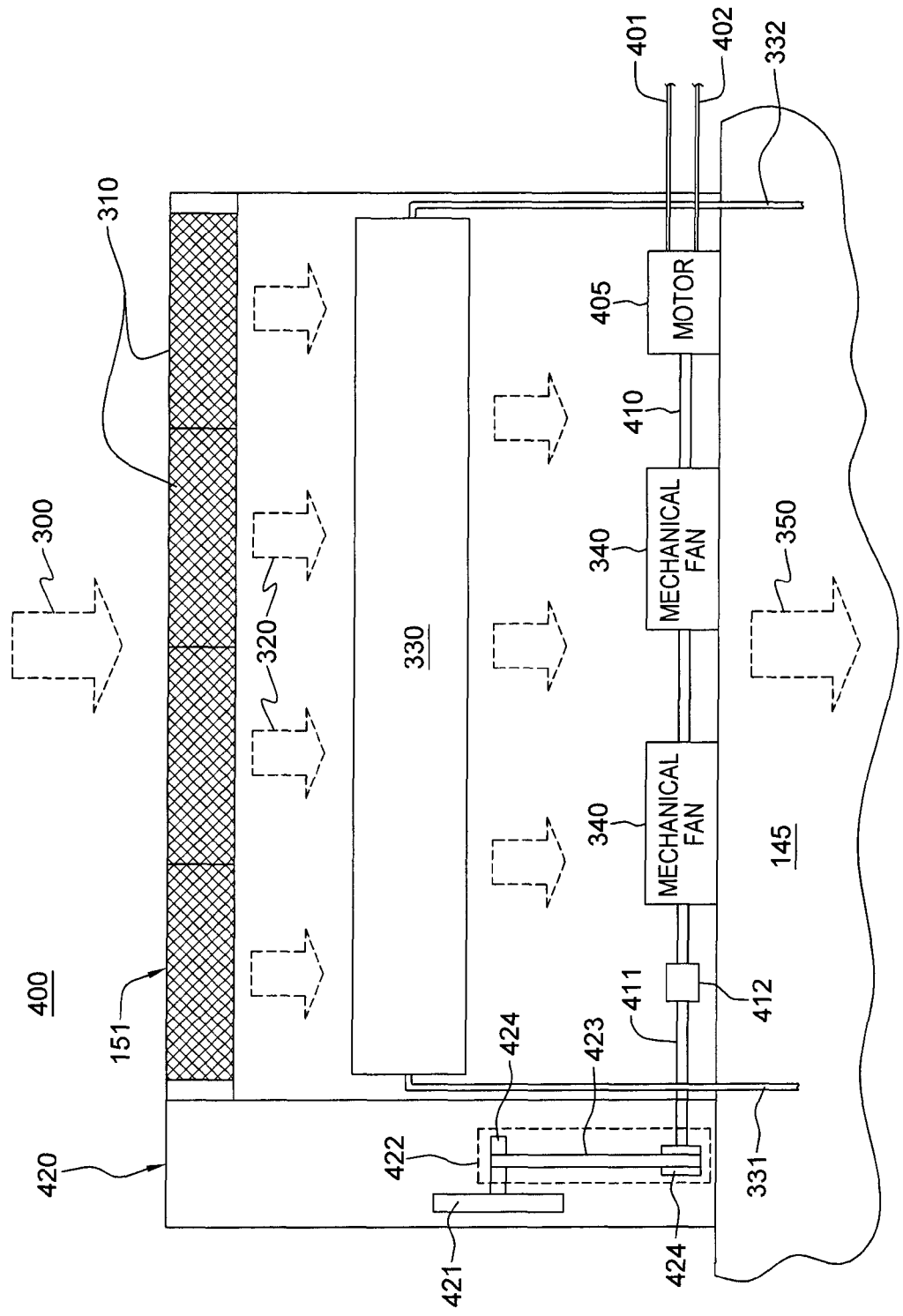
FIG. 4 is a cross-sectional elevational view of one embodiment of an apparatus comprising an air-moving assembly and auxiliary turbine drive for, for instance, a data center such as depicted in FIG. 1, in accordance with one or more aspects of the present invention.

FIG. 4 illustrates one embodiment of an apparatus comprising an air-moving assembly 400 configured, in this example, as a computer-room, air-moving assembly, and more specifically, as a computer-room air-conditioner (CRAC) unit with a top-to-bottom airflow design. The embodiment illustrated in FIG. 4 is particularly useful for cooling one or more electronics racks of a data center having a raised floor configuration, with an under-floor cool air plenum, such as depicted in FIG. 1. Note that this implementation of the air-moving assembly builds upon the computer-room, air-moving assembly 150 of FIG. 3, and is provided by way of example only.

As illustrated, and as partially explained above in connection with the embodiment of FIG. 3, warm computer-room air 300 enters air-moving assembly 400 via one or more open inlet vents 151 at an air inlet of the assembly, and optionally flows through a set of air filters 310. After passing through air filters 310, the filtered, warm air 320 is cooled as it passes across one or more air-to-liquid heat exchanger(s) 330. Coolant is provided to the heat exchanger(s) via coolant supply line 331 and coolant return line 332. The filtered, warm air 320 is drawn across air-to-liquid heat exchanger(s) 330 via, in this example, multiple mechanical fans 340, such as multiple centrifugal fans disposed (by way of example only) in the lower portion of the air-moving assembly. The cooled air 350 is pushed by mechanical fans 340 into space 145 under the raised floor to create the pressurized plenum needed to facilitate raised floor data center cooling via the perforated tiles discussed above. As noted, the air-to-liquid heat exchanger(s) may be supplied (in one example) with sub-ambient chilled coolant from a refrigeration chiller. This chilled liquid coolant absorbs heat from the warm air passing across the air-to-liquid heat exchanger(s), and rejects the heat to the refrigerant chiller plant (not shown).

In the depicted embodiment of FIG. 4, a shaft 410 couples a motor 405 to mechanical fans 340. The mechanical fans are coupled to shaft 410 to rotate, at least in part, with the shaft, and the motor is coupled to the shaft to rotatably drive the shaft. Electrical circuit lines 401, 402 are provided to power motor 405 via, for instance, utility power, or alternatively, backup generated power produced by one or more electric generators (not shown) associated with the data center.

An extended housing 420 is depicted in FIG. 4 (by way of example only) at one side of air-moving assembly 400. In the depicted implementation, a turbine coupling mechanism 412 (described further below) selectively couples a shaft extender 411 to shaft 410 so as to rotate therewith when closed. The shaft extender extends into extended housing 420 containing a turbine 421 (such as a Pelton Turbine) of an auxiliary turbine drive of the apparatus. Note that, as an alternate implementation, shaft 410 could be replaced with a longer shaft extending to the left, for instance, into extended housing 420, with the coupling mechanism 412 being disposed between the turbine 421 and the shaft 410 rotating mechanical fans 340.

In the illustrated implementation, a belt drive assembly 422 is provided coupling turbine 421 to shaft extender 411. Belt drive assembly 422 includes a belt 423 and a gearing mechanism 424. In one implementation, gearing mechanism 424 provides an increased rotational speed from turbine 421 to shaft 410 in backup mode. The specified period of time for the turbine to affect continuing rotation of shaft 410 during a power outage may be provided by appropriately sizing the auxiliary turbine drive (comprising turbine 421, and discussed below) and selecting the increased rotational speed (for instance, through the gearing mechanism 424) to achieve the desired time period for the continued rotation of the shaft within which to allow motor operation to be reestablished. Details of different embodiments of an auxiliary turbine drive such as disclosed herein are described further below with reference to FIGS. 7A-9C.

One issue with an apparatus such as described above in connection with FIG. 4 is the possibility for an electromotive force (emf) to be generated during power outage back through the motor onto the electrical circuit lines. Thus, some of the shaft work is lost in producing electricity rather than turning the fans, thereby negatively affecting the cooling ride-through provided by the turbine(s).

Figure 5A:
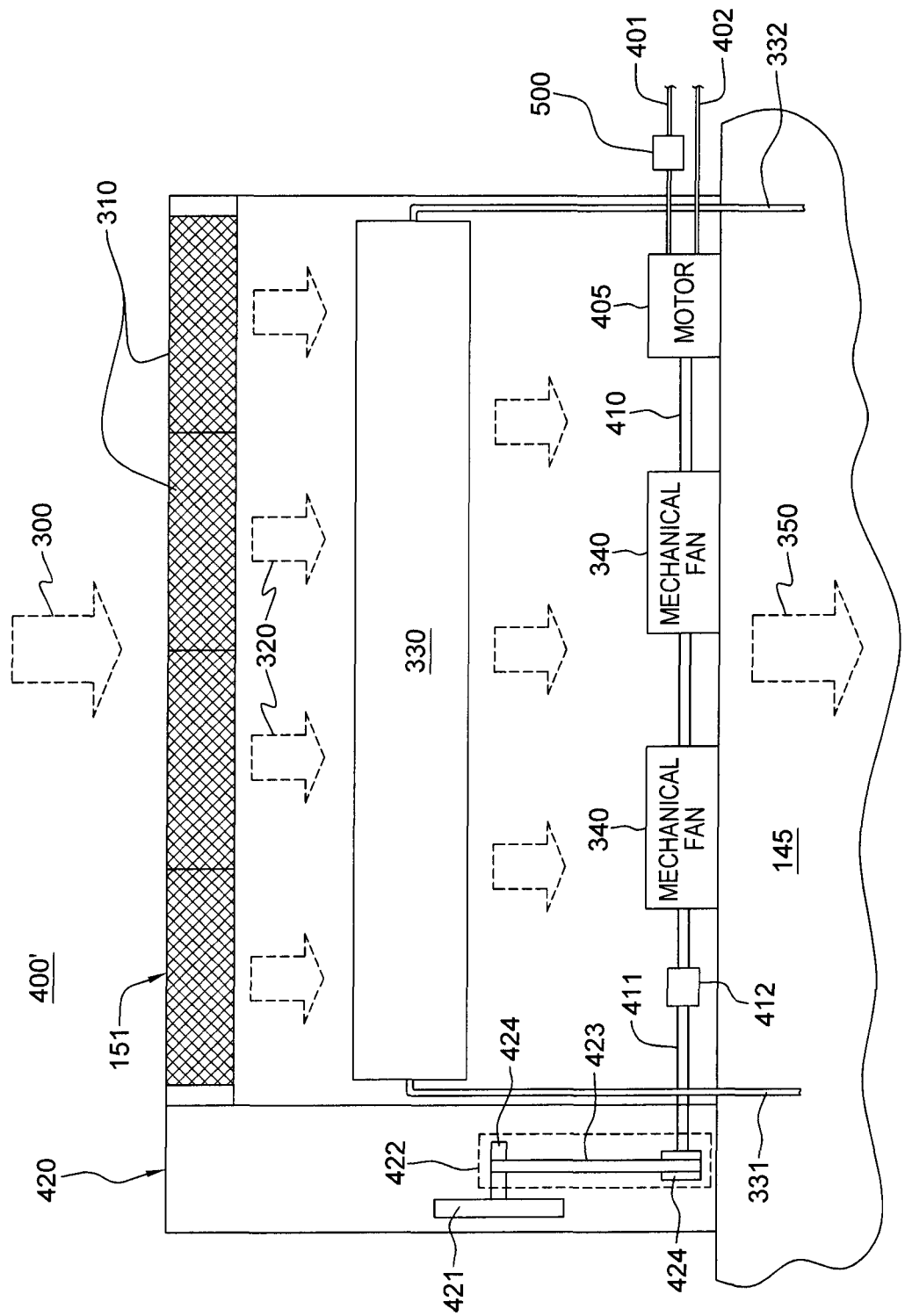
FIG. 5A is a cross-sectional elevational view of a further embodiment of an apparatus comprising an air-moving assembly and auxiliary turbine drive, in accordance with one or more aspects of the present invention.
Figure 5B:
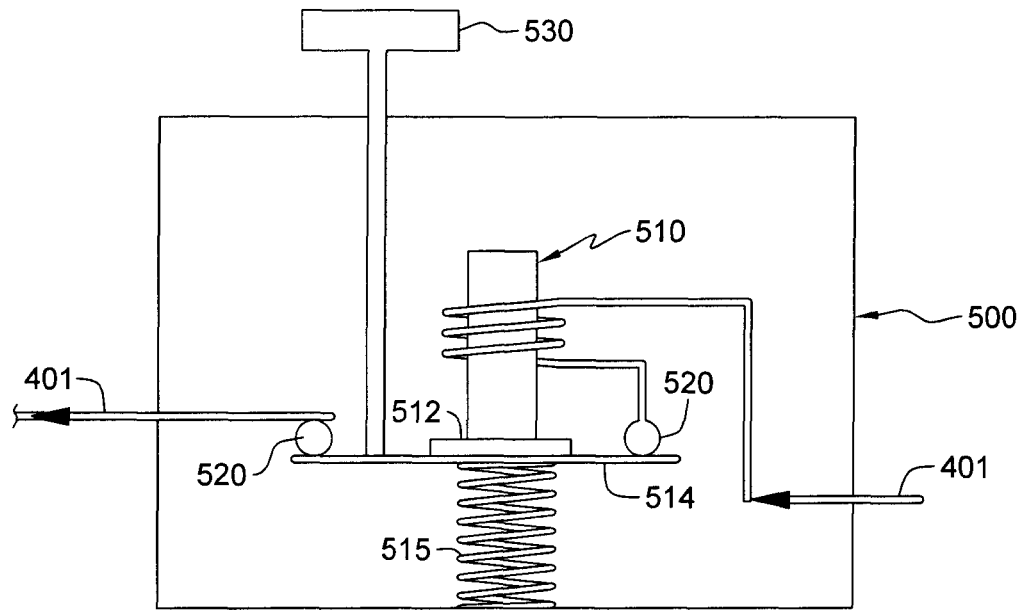
FIG. 5B depicts one embodiment of the electromotive force (emf) decoupling mechanism of the apparatus of FIG. 5A, with the electromagnetic switch shown in closed circuit state, in accordance with one or more aspects of the present invention.
Figure 5C:
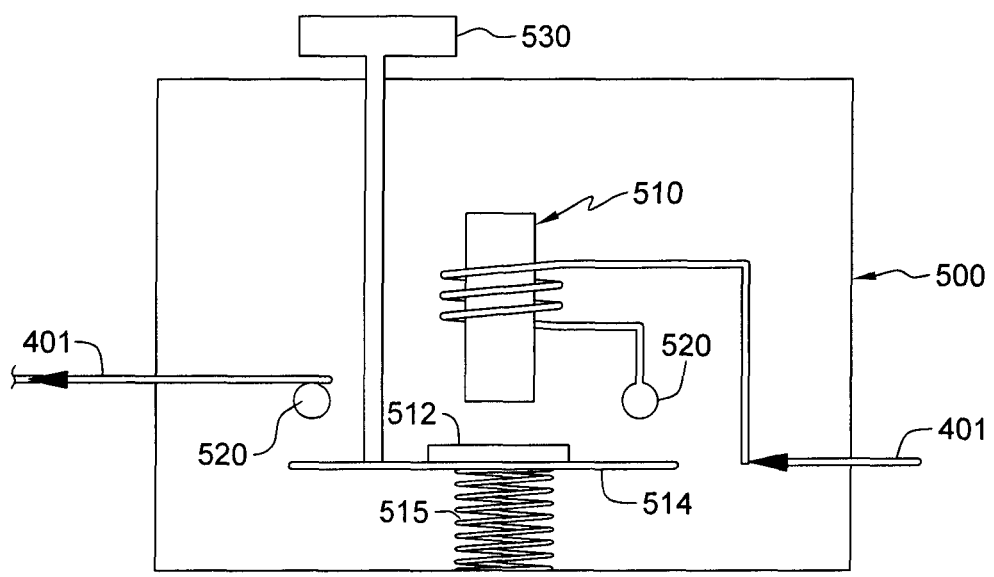
FIG. 5C depicts the emf decoupling mechanism of FIG. 5B, with the electromagnetic switch shown in open-circuit state, responsive to, for instance, power loss to the motor of the air-moving assembly, in accordance with one or more aspects of the present invention.

FIGS. 5A-5C depict one solution to this issue. In these figures, an electromotive force (emf) decoupling mechanism is provided, which is depicted as an electromagnetic switch 500 coupled, for instance, to circuit line 401 providing power to motor 405 during normal operation. In implementation, the electromagnetic switch automatically switches to an open circuit state with loss of power to the motor through the circuit line 401. This will prevent electromotive force from being generated back onto circuit line 401, and thereby minimize losses at motor 405 due to continued shaft rotation during the interruption in power to the motor, thereby improving conversion of the rotational energy in the turbine to rotation of the shaft, and thus, rotation of the mechanical fans. Further, once back emf is negated, the momentum or inertia within the motor rotor will assist in continued shaft rotation during the interruption in power to the motor.

FIGS. 5B & 5C depict one embodiment of electromagnetic switch 500, with the switch shown in closed circuit state in FIG. 5B, and open circuit state in FIG. 5C. As illustrated, in normal, closed circuit operation, power is supplied to the motor of the air-moving assembly, and an electromagnet 510 is energized to hold a non-permanent, ferromagnetic material 512 in contact, which in turn holds a conductive plate 514 in electrical contact with switch contacts 520, overcoming a spring 515 biasing of conductive plate 514 and non-permanent, ferromagnetic material 512 away from the terminals.

As illustrated in FIG. 5C, when power on circuit line 401 is lost, the electromagnetic force pulling non-permanent, ferromagnetic material 512 towards electromagnet 510 is interrupted, and spring 515 pulls conductive plate 514 away from switch contacts 520, open circuiting the electromagnetic switch, and thereby automatically decoupling the motor from the circuit line, and preventing electromotive force (emf) back into the circuit line from the motor resulting from continued rotation of the shaft driven by the turbine drive. In one embodiment, the electromagnetic switch may be reset to closed circuit state using a manual reset 530 coupled to conductive plate 514, that is, to bring non-permanent, ferromagnetic material 512 back into contact with electromagnet 510 to reestablish flow of current through the switch once power is restored. Note that in this implementation, the circuit line is automatically open circuited upon a power loss through the circuit line, which automatically avoids back electromotive force being generated by motor 405 onto the line.

Figure 6A:
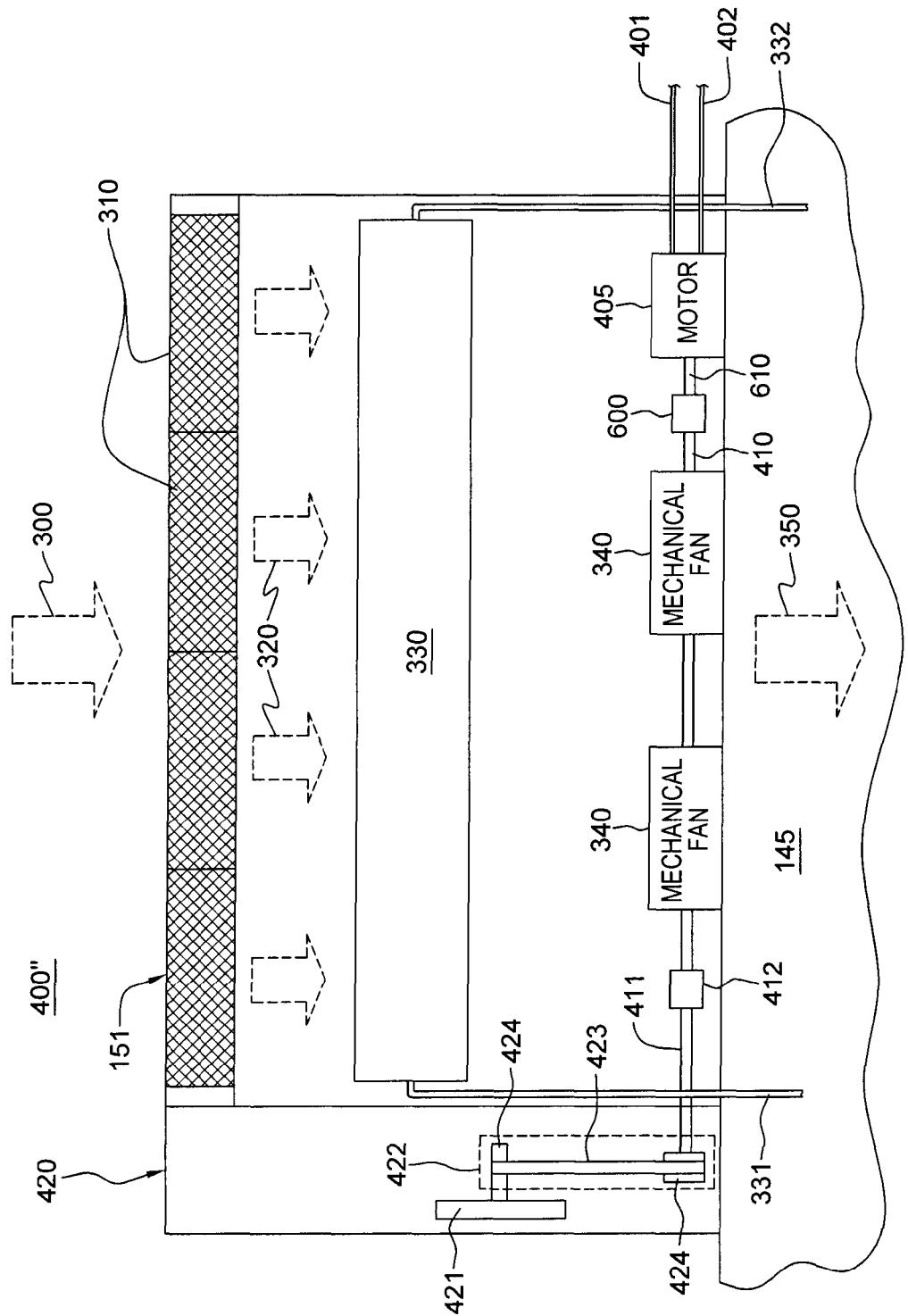
FIG. 6A depicts a cross-sectional elevational view of another embodiment of an apparatus comprising an air-moving assembly and auxiliary turbine drive, in accordance with one or more aspects of the present invention.
Figure 6B:
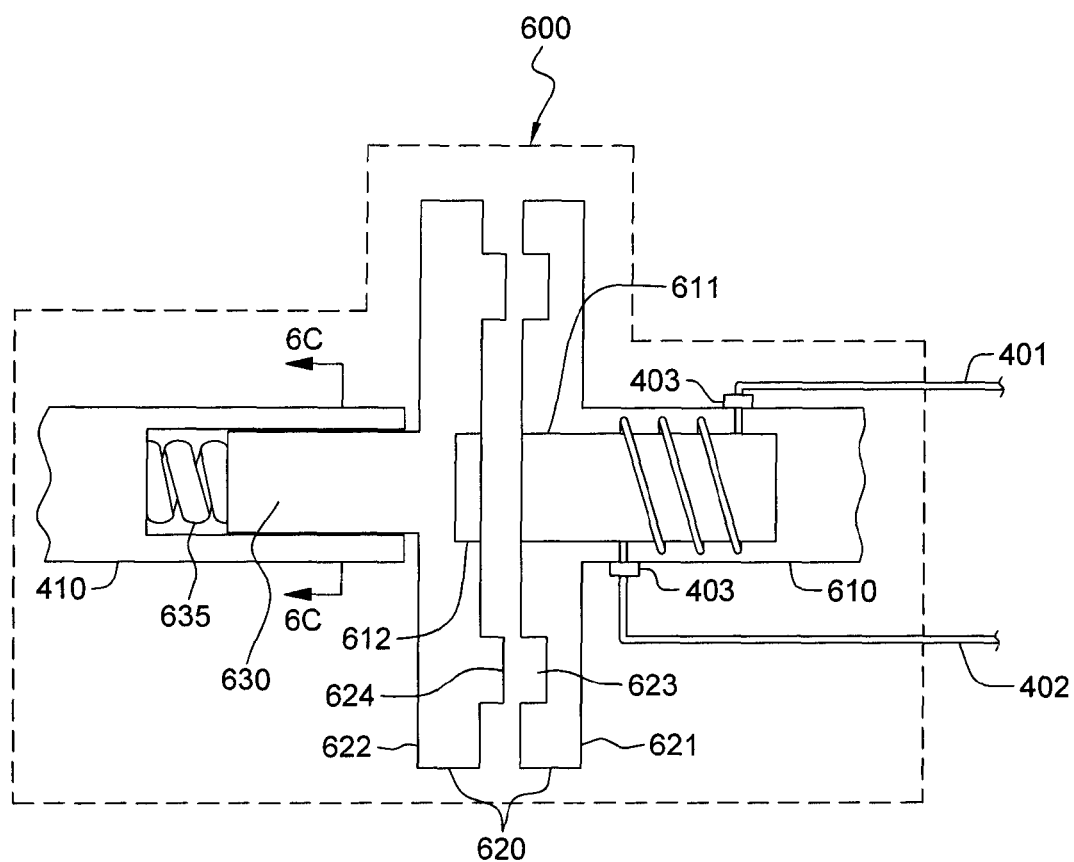
FIG. 6B depicts by way of example one embodiment of a motor decoupling mechanism, or clutch, for the apparatus of FIG. 6A, in accordance with one or more aspects of the present invention.
Figure 6C:
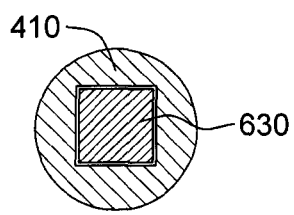
FIG. 6C is a cross-sectional elevational view of the shaft and clutch of FIG. 6B, taken along line 6C-6C thereof, in accordance with one or more aspects of the present invention.

FIGS. 6A-6C depict an alternate embodiment of the apparatus of FIG. 4, where the apparatus is modified to also include a motor decoupling mechanism, generally denoted 600. In this configuration, turbine coupling mechanism 412 and motor decoupling mechanism 600 may each be a respective mechanical or electromechanical coupling/decoupling mechanism. In one or more implementations, decoupling mechanism 600 is disposed between shaft 410 and a drive shaft 610 of motor 405, and may be a clutch which automatically decouples shaft 410 from drive shaft 610 with the interruption in power to motor 405, and coupling mechanism 412 may be another clutch which automatically couples extender shaft 411 to shaft 410 with the interruption in power to motor 405.

FIGS. 6B & 6C depict one embodiment of the decoupling mechanism (and by analogy, the coupling mechanism). In this embodiment, two interlocking plates 620 are employed. The interlocking plates 620 include a first plate 621 and a second plate 622, which are respectively coupled to drive shaft 610 and shaft 410. Additionally, an electromagnet 611 and a permanent magnet 612 are associated with first plate 621, and second plate 622, respectively. In this implementation, the circuit lines 401, 402 are connected via bushing connectors 403 to electromagnet 611 to power the electromagnet when power is being supplied to the motor 405 (see FIG. 6A). When powered, electromagnet 611 exerts a force on permanent magnet 612, which results in the first and second plates being mechanically coupled to rotate together. This action overcomes a spring 635 force biasing plate 622 away from first plate 621. Interlocking members 623, 624 may be provided as mating features to lock the plates together under normal operation. Alternatively, friction pads, similar to those found in automotive clutches could be employed in the decoupling mechanism. In the depicted embodiment, second plate 622, with permanent magnet 612, is integrated with a post 630 which extends into an end of shaft 410 within an appropriately configured opening to receive post 630. The opening also contains the desired spring 635 biasing. By way of example, in one implementation, support post 630 may be rectangular in shape, as illustrated in the cross-sectional view of FIG. 6C.

In operation, when power on circuit lines 401, 402 is interrupted, electromagnet 611 stops exerting a force on permanent magnet 612, which causes spring 635 to pull second plate 622 away from first plate 621, thereby separating the drive shaft 610 from shaft 410, and allowing shaft 410 to rotate freely from the drive shaft, using the rotational energy provided by the turbine 421. When power is restored, electromagnet 611 exerts a force on permanent magnet 612, pulling plate 622 towards plate 621, and depending upon alignment, one shaft may rotate relative to the other until mating features 623, 624 are aligned, and the shafts properly couple through mechanism 600, allowing them to spin in unison.

Note that if the locking feature of FIG. 6B is replaced by, for instance, friction pads, then the reactivation of the electromagnet is sufficient to cause the two shafts to couple and to begin to rotate at a decreasing speed, until the motor has sped up sufficiently to exceed the current shaft speed, and once again begin accelerating the coupled shafts, decoupling coupling mechanism 412 and turbine 421 from the shaft. In this configuration, there may be initial slippage between the shaft joining plates until the drive shaft has built up sufficient rotational speed.

Figure 6D:
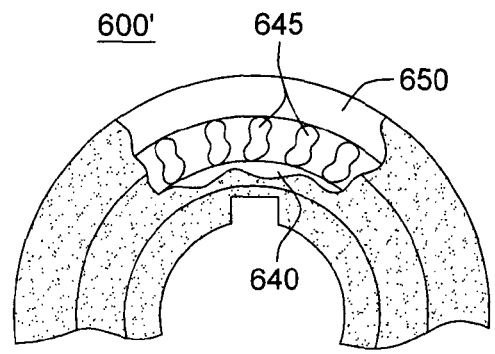
FIG. 6D depicts an alternate embodiment of the motor decoupling mechanism, or clutch, of the apparatus of FIG. 6A, in accordance with one or more aspects of the present invention.

FIG. 6D depicts an alternate embodiment of a coupling/decoupling mechanism 600' for an apparatus such as depicted in FIG. 6A. In this alternate embodiment, the coupling/decoupling mechanisms may be implemented as a sprag clutch with an inner-rotational member 640 coupled to an outer-rotational member 650 via multiple sprags 645.

In normal operation, inner-rotational member 640 may be connected to drive motor 610 (see FIG. 6A), and spins at the motor driving speed. This driving motion causes sprags 645 to rotate counterclockwise, and enter a "locked" position, thus mechanically coupling inner-rotational member 640 to outer-rotational member 650. Outer rotational member 650 is locked to inner-rotational member 640, and has the same rotational speed. The outer-rotational member 650 is mechanically coupled to shaft 410, which drives mechanical fans 340, as shown in FIG. 6A. Coupling mechanism 412 may be a similar clutch, but attached to work in the opposite direction, and thus be disconnected during normal operation of the motor and shaft.

In the event of a power interruption, the loss of electrical power causes motor 405 to lose speed, thus reducing speed of inner-rotational member 640. The outer-rotational member 650 also reduces speed in this event, but due to the larger momentum resulting from the presence of the turbine, maintains a rotational speed greater than the inner-rotational member. Thus, the outer-rotational member 650 spins relatively faster (in the same direction as the inner-rotational member), compared to the inner-rotational member. The higher relative speed causes sprags 645 to rotate clockwise, and enter an "unlocked" position, allowing the outer-rotational member 650 to freely spin and mechanically uncouple from the inner rotational member 640. Thus, as long as the outer-rotational member continues to spin relatively faster than the inner-rotational member, which is connected to the motor drive, the outer-rotational member will spin freely, and not be slowed by the frictional losses at the motor. The sprags on the turbine-side of the shaft, that is, for coupling mechanism 412 (FIG. 6A) rotate anti-clockwise as the speeds begin to equal, and thus locks the extended shaft and shaft.

Once power is restored to the motor, the motor and the attached inner-rotational member 640 of the motor-side decoupling mechanism will begin to accelerate, thus increasing speed. For a small period of time, the outer-rotational shaft will continue to freely spin. However, as motor 405 accelerates, the inner-rotational member will eventually rotate at a speed exceeding the outer-rotational member. When this happens, sprags 645 will rotate to the counterclockwise position, and couple the motor-side shafts back together, again causing the outer-rotational member 650 to match in rotational speed the inner-rotational speed 640. Note that once power is restored, the motor and attached inner shaft begin to accelerate. For a small period of time, the outer shaft will continue being locked to the turbine speed. As the motor speed increases, however, the respective coupling and decoupling of the motor-side clutch and turbine-side clutch will occur automatically.

Note from the above discussion that, in the coupling/decoupling mechanisms of FIGS. 6B-6D, the reset process is automatic, requiring no manual input from service personnel in order to reestablish coupling between, for instance, the drive shaft and the main shaft of the air-moving assembly, or the main shaft and the shaft extender (or turbine shaft).

Figure 7B:
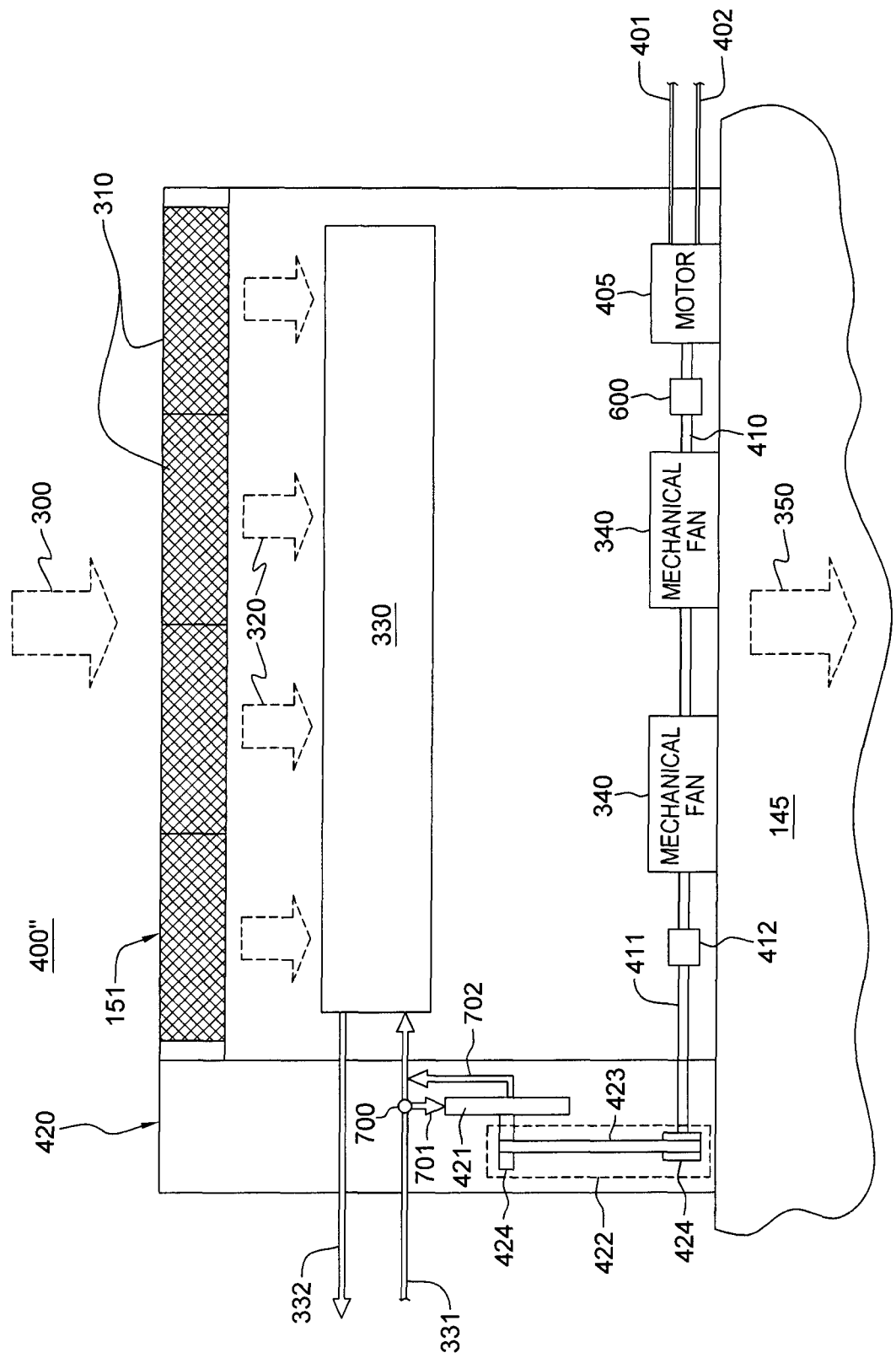
FIG. 7B is a cross-sectional elevational view of another embodiment of an apparatus comprising an air-moving assembly and auxiliary turbine drive for, for instance, a data center, in accordance with one or more aspects of the present invention.

Liquid to drive turbine(s) 421 of the auxiliary turbine drive may be provided using a variety of approaches. FIGS. 7A & 7B depict two implementations where the liquid used to drive turbine 421 comprises a portion of liquid coolant being fed to, for instance, a heat exchanger(s) associated with the air-moving assembly of the apparatus. The embodiments of FIGS. 7A & 7B are provided by way of example only.

Generally stated, the turbine(s) of the auxiliary turbine drive may be coupled in fluid communication to receive liquid coolant from and return liquid coolant to either or both of coolant supply line 331 and coolant return line 332 coupled to heat exchanger(s) 330, in the examples described above. In FIG. 7A, turbine 421 is coupled to receive coolant from coolant supply line 331 via a turbine supply line 701 and a turbine flow control valve 700, and as shown, turbine 421 exhausts coolant via a turbine exhaust line 702 coupled to coolant return line 332. Numerous modifications to this plumbing arrangement may be made. For instance, the implementation of FIG. 7B is similar to the arrangement of FIG. 7A, with the exception that turbine exhaust line 702 is coupled to coolant supply line 331 downstream of turbine flow control valve 700, meaning that any liquid passing through turbine 421 also passes through heat exchanger(s) 330. In FIG. 7A, the liquid coolant flow in coolant supply line 331 is split between turbine(s) 421 and heat exchanger(s) 330, while in the embodiment of FIG. 7B, liquid exhaust from turbine(s) 421 is sent through heat exchanger 330 before exhausting via coolant return line 332.

As explained in the examples below in connection with FIGS. 8A-9C, the liquid within liquid supply line 331 may be provided by a liquid supply tank, such as a cold water emergency tank. In such a case, due to the relatively large flow rate required to turn turbine 421, it may be desirable to directly return the exhaust liquid to the coolant return line 332 as shown in FIG. 7A, rather than passing the liquid through the heat exchanger(s), which typically has a lower specified flow rate. The embodiment of FIG. 7B could be employed, for instance, where the heat exchanger(s) can support the higher flow rate used to drive the turbine 421. This embodiment is also suitable if a low flow, high head style turbine is installed, rather than a high flow, low head turbine, such as the above-referenced Pelton turbine. As noted, belt drive assembly 422 may be provided in association with turbine 421 to, for instance, increase the rotational speed by, for instance, 5×, such that the turbine would need to spin at 100 rpms to provide 500 rpms to shaft 410.

Figure 8A:
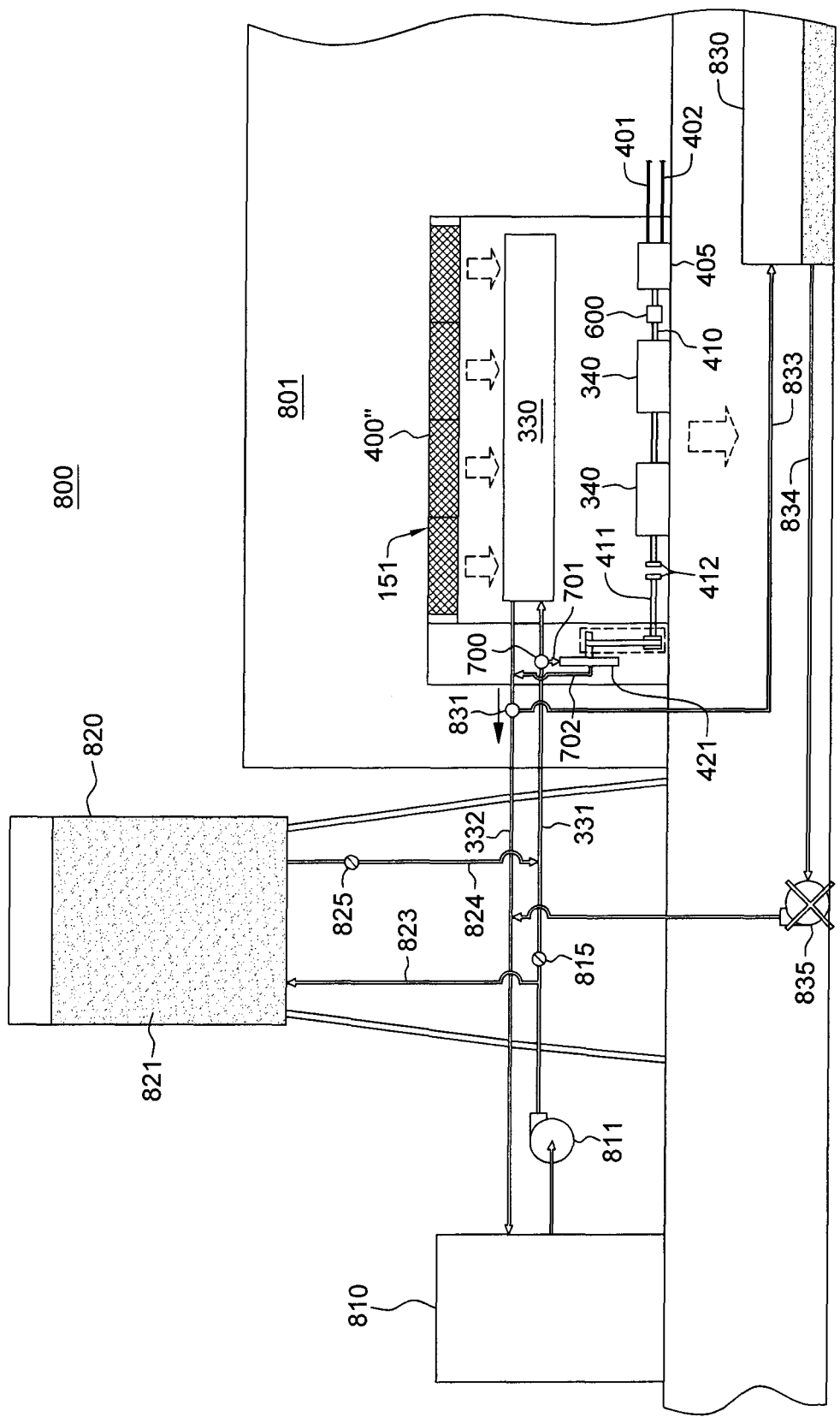
FIGS. 8A-8C are a schematic of one embodiment of a data center comprising, in part, an apparatus including an air-moving assembly and an auxiliary turbine drive, and illustrating normal operation, loss of power to the motor of the air-moving assembly, and restoration of power to the motor, in accordance with one or more aspects of the present invention.
Figure 8B:
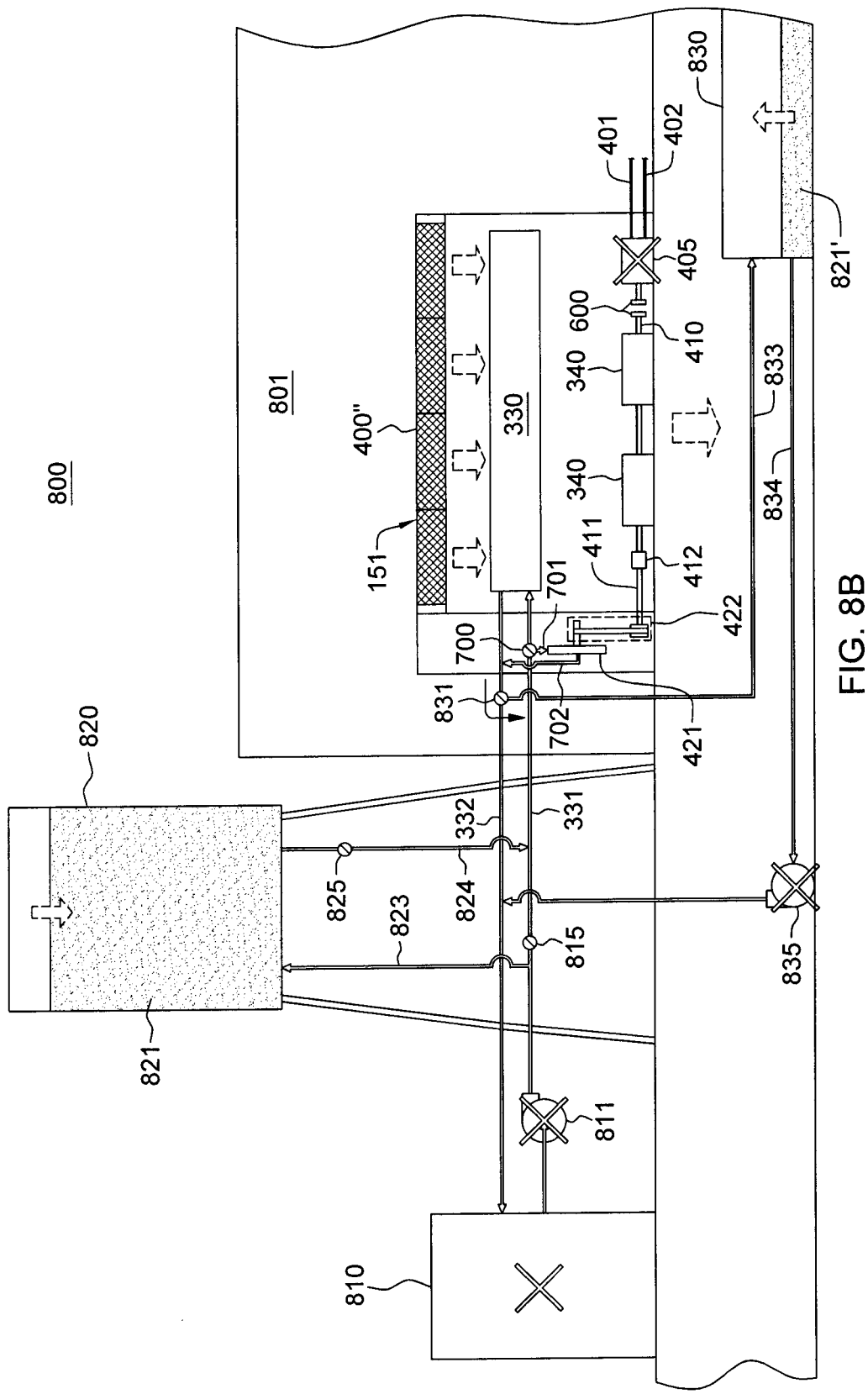
Figure 8C:
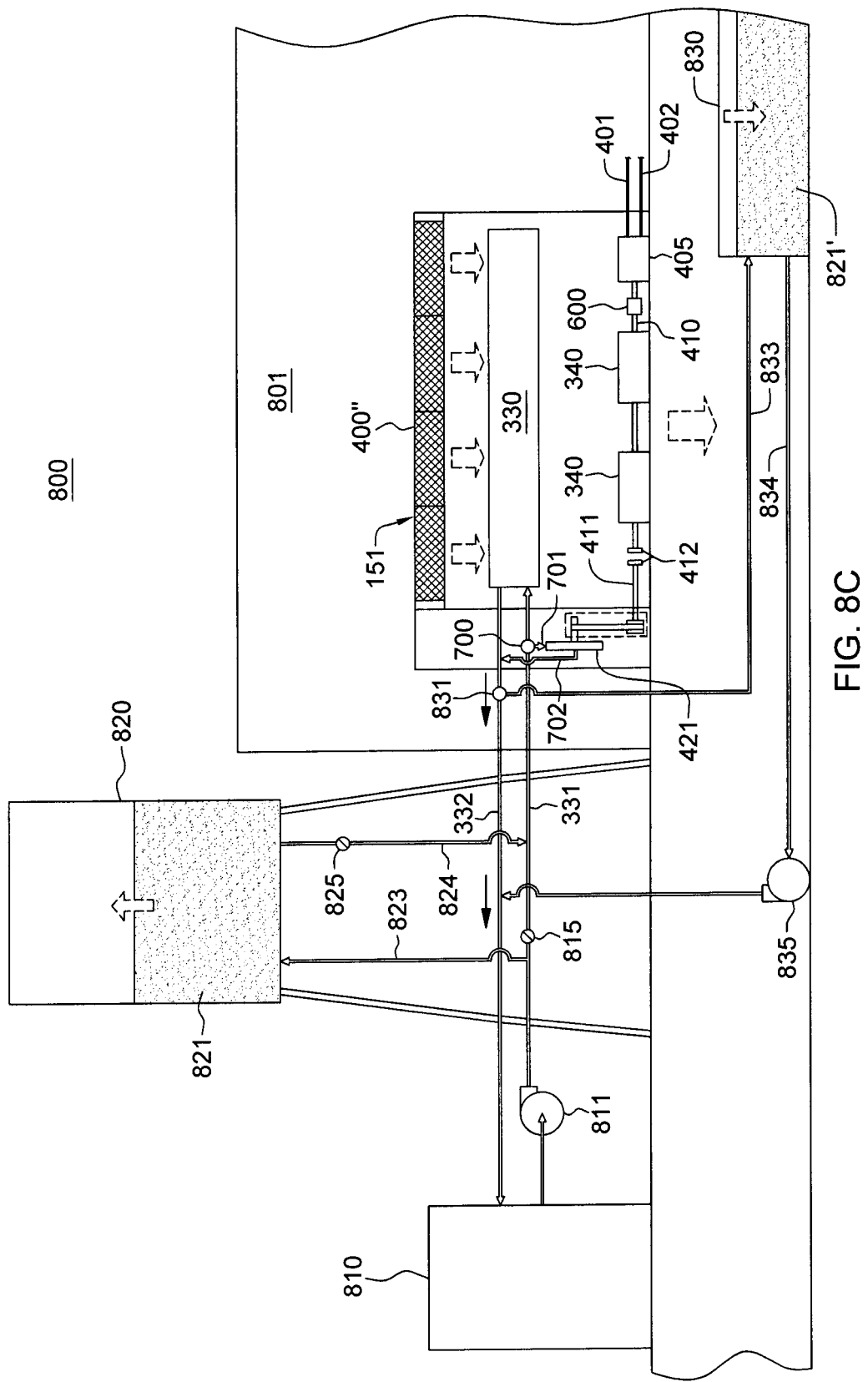

By way of example, FIGS. 8A-8C depict one embodiment of a data center, generally denoted 800, comprising, for instance, a computer room 801 including an apparatus comprising an air-moving assembly and an auxiliary turbine drive, such as described herein. In this embodiment, a refrigeration chiller 810 provides chilled liquid coolant, which is pumped via a coolant pump 811 through coolant supply line 331 to heat exchanger(s) 330 associated with the air-moving assembly 400", as well as, optionally, through a liquid storage tank 820. Storage tank 820, which is provided, in this example, in the form of a liquid storage tower, stores a backup supply of liquid 821, which in this embodiment, comprises the chilled liquid coolant being pumped to the heat exchanger(s) 330. A backup inlet line 823 and backup outlet line 824 are provided coupled to coolant supply line 331 to facilitate circulation of a portion of the pumped, chilled liquid coolant through liquid storage tank 820. The amount of chilled liquid coolant flowing through the storage tank is controlled via, for instance, a supply valve 815 associated with coolant supply line 331 and a storage control valve 825 associated with backup outlet line 824. These valves, along with others described herein, are electrically held in an operational position, and revert to a predetermined, unpowered position upon loss of power.

In the embodiment of FIG. 8A, data center 800 is illustrated in normal operation, with motor 405 being powered and driving mechanical fans 340. In this embodiment, turbine flow control valve 700, as well as a backup control valve 831 coupled to coolant return line 332, are in open position allowing all chilled liquid coolant to flow through coolant supply line 331 to heat exchanger(s) 330 and be returned via coolant return line 332 to chiller 810. Note that data center 800 further includes a liquid exhaust storage tank 830 and an exhaust coolant loop comprising an exhaust coolant inlet line 833 into exhaust storage tank 830 and an exhaust coolant outlet line 834 from exhaust storage tank 830. (When operational, an exhaust liquid return pump 835 facilitates withdrawal of the exhaust liquid from exhaust storage tank 830 for return to coolant return line 332, as illustrated.) Note that in the depicted normal operating mode, motor coupling mechanism 600 is closed, coupling motor 405 to mechanical fans 340 via shaft 410, and turbine coupling mechanism 412 is open, separating shaft extender 411 and turbine 421 from shaft 410.

In FIG. 8B, utility power is assumed to be lost, rendering motor 405, chiller 810, coolant pump 811 and exhaust liquid return pump 835 inoperable, at least, for a period of time required, for instance, to bring up one or more back-up generators for the data center or to restore main utility power. When power is lost, motor decoupling mechanism 600 is opened, separating motor 405 from shaft 410, and turbine coupling mechanism 412 is closed, coupling turbine 421 to shaft 410. During this time, chilled liquid coolant in liquid storage tank 820 is released by closing supply valve 815 and opening storage control valve 825, allowing gravity to feed liquid coolant in parallel to both turbine(s) 421 and heat exchanger(s) 330, as described above in connection with FIG. 7A. Note that exhausting coolant in coolant return line 332 is diverted by backup control valve 831 away from chiller 810 into exhaust storage tank 830, where the heated exhaust coolant 821' is collected until power is returned to data center 800, either through restoration of the primary utility power to the data center, or, for example, starting back-up power generation for the data center. Once power is restored, then as illustrated in FIG. 8C, a portion of the chilled liquid coolant is diverted into liquid storage tank 820 commensurate with pumping of exhaust coolant 821' from exhaust storage tank 830 into coolant return line 332 for passage through chiller 810. Note that once power is restored, motor coupling mechanism 600 is closed, coupling motor 405 to shaft 410, and turbine coupling mechanism 412 is open, disengaging turbine 421 from shaft 410.

Figure 9A:
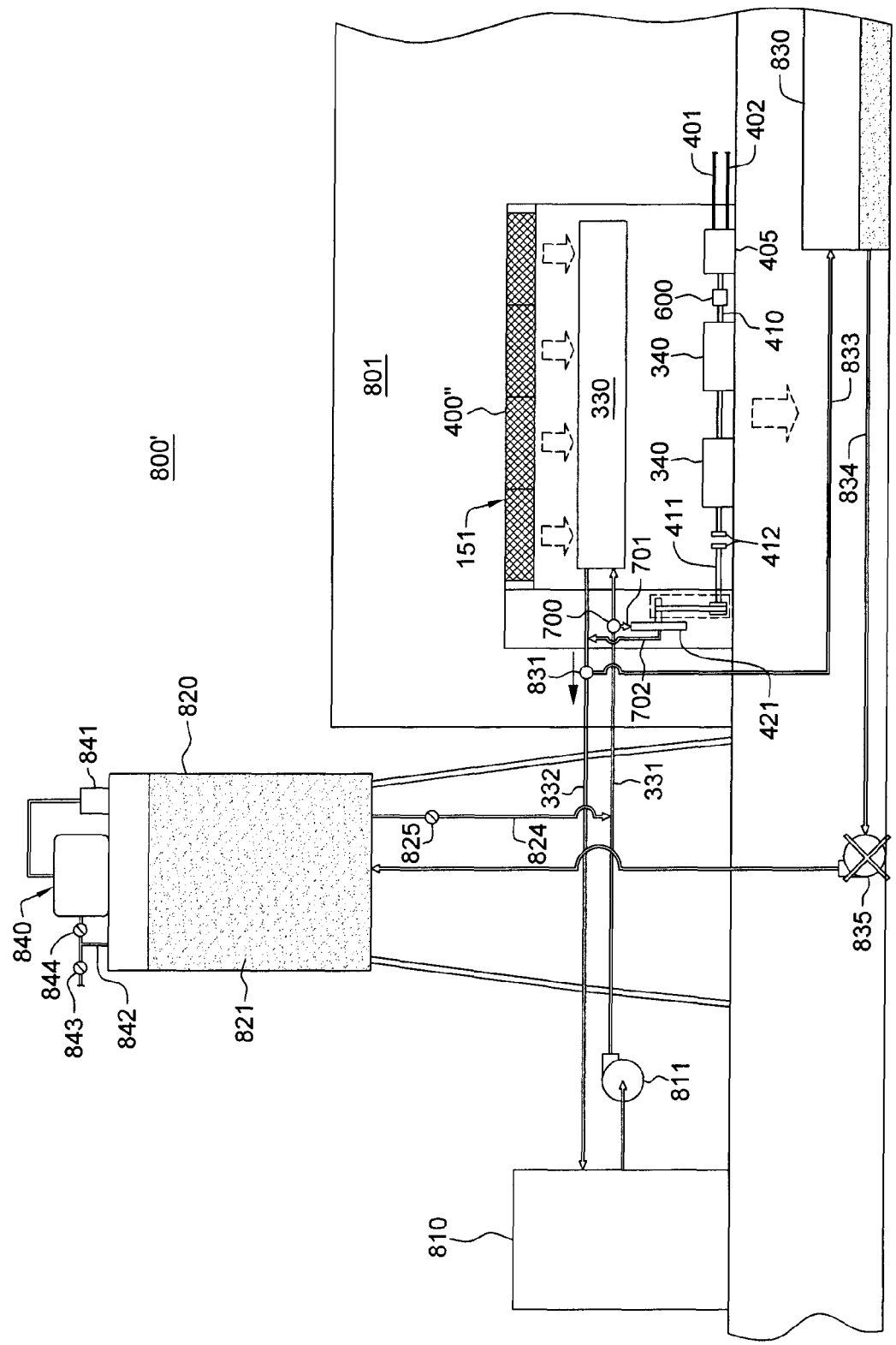
FIGS. 9A-9C are a schematic of another embodiment of a data center comprising, in part, an apparatus including an air-moving assembly and an auxiliary turbine drive, and illustrating normal operation, loss of power to the motor of the air-moving assembly, and restoration of power to the motor, in accordance with one or more aspects of the present invention.
Figure 9B:
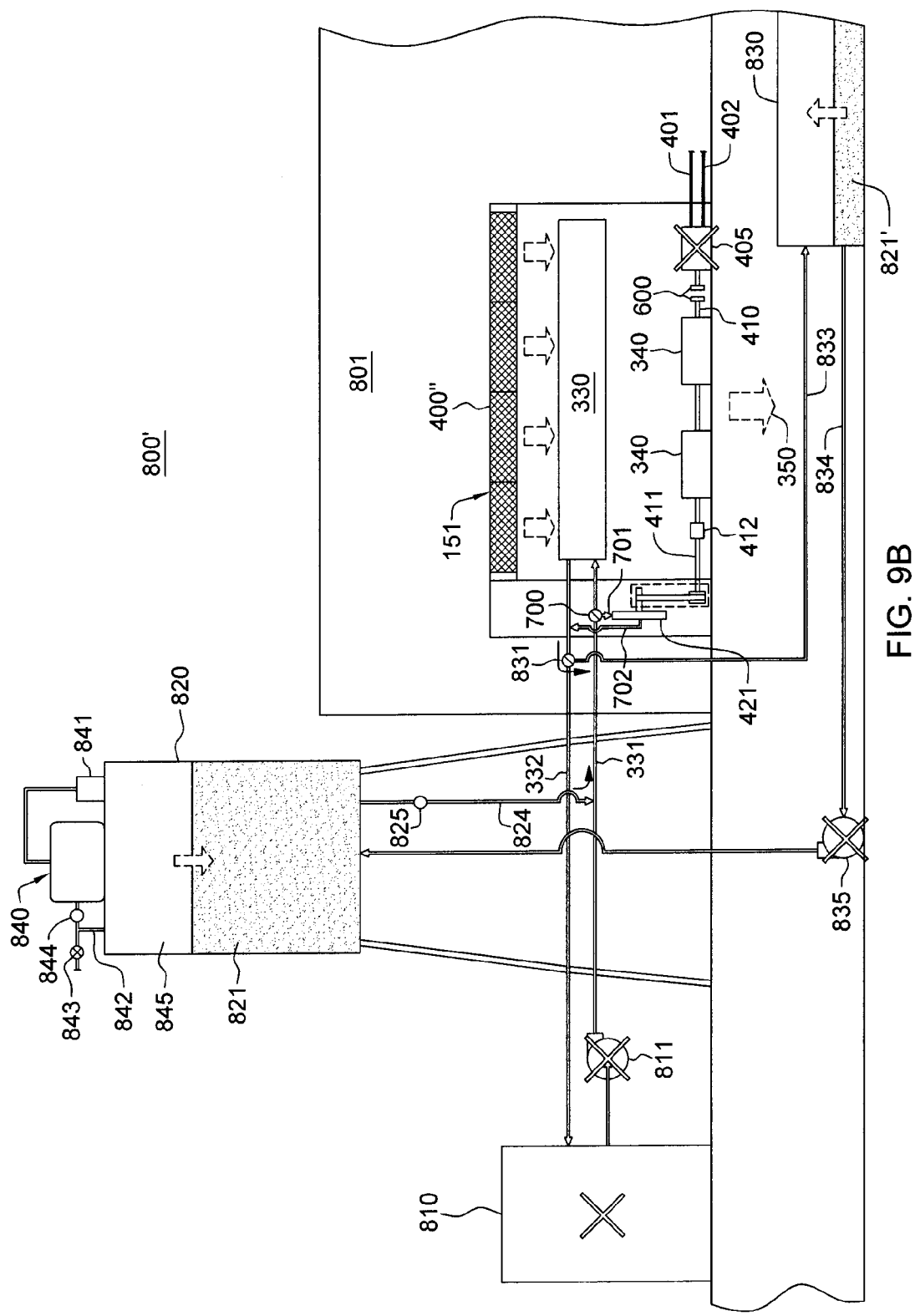
Figure 9C:
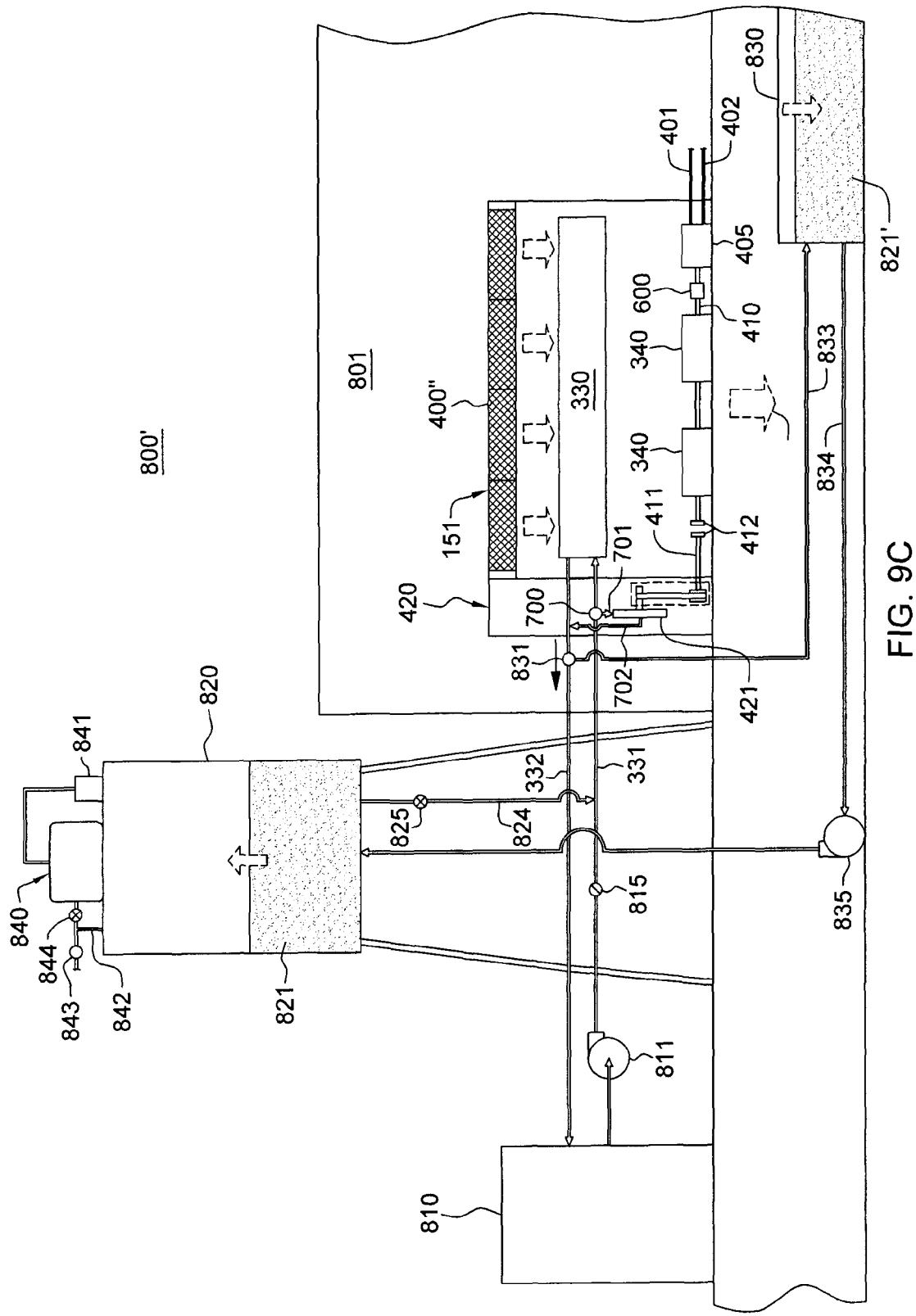

FIGS. 9A-9C depict another embodiment of a data center, generally denoted 800', similar to data center 800 described above in connection with FIGS. 8A-8C. As illustrated in FIG. 9A, in normal operation, refrigeration chiller 810 provides chilled liquid coolant, which is pumped via coolant pump 811 through coolant supply line 331 to heat exchanger(s) 330 associated with air-moving assembly 400". As illustrated, this implementation varies from that of FIGS. 8A-8C in that chilled liquid coolant is not being pumped to liquid storage tank 820 in normal mode operation. Thus, the backup inlet line 823 and supply valve 815 of the embodiment of FIGS. 8A-8C may be omitted.

In of FIG. 9A, data center 800' is illustrated in normal operation, with motor 405 being powered and driving mechanical fans 340. In this mode, turbine flow control valve 700, as well as backup control valve 831 coupled to coolant return line 332, are in open position, directing all chilled liquid coolant in coolant supply line 331 to flow through heat exchanger(s) 330, and be returned via coolant return line 332 to chiller 810. In this normal operating mode, motor coupling mechanism 600 is closed, coupling motor 405 to mechanical fans 340 via shaft 410, and turbine coupling mechanism 412 is opened, disengaging turbine 421 from shaft 410.

In FIG. 9B, utility power is assumed to be lost, rendering motor 405, chiller 810, coolant pump 811, and exhaust return liquid pump 835 inoperable, at least for a period of time required, for instance, to bring up one or more backup generators for the data center. In this mode, motor coupling mechanism 600 is opened, separating motor 405 from shaft 410, and turbine coupling mechanism 412 is closed, coupling extended shaft 411 and turbine 421 to shaft 410. During this time, liquid coolant stored in liquid storage tank 820 is released by opening storage control valve 825, allowing gravity to feed liquid coolant to both turbine(s) 421 and heat exchanger(s) 330, as described above in connection with FIG. 7A. Note that in this embodiment, a pressurized tank 840 may be provided in association with storage tank 820. During normal operation, a compressor 841 maintains pressure in pressurized tank 840. Upon loss of power, pressurized tank 840 is coupled via valve 844 and line 842 to release pressurized air 845 into liquid storage tank 820 to pressurize liquid storage tank 820 and provide extra head for enhanced flow of liquid coolant to turbine(s) 421 and heat exchanger(s) 330.

As with the embodiment of FIGS. 8A-8C, exhausting coolant in coolant return line 332 is diverted by backup control valve 831, away from chiller 810 into exhaust storage tank 830, where the heated exhaust coolant 821' is collected until power is returned to data center 800'. Once power is restored, then as illustrated in FIG. 9C, exhaust liquid return pump 835 is activated to pump exhaust liquid coolant from exhaust storage tank 830 directly back into liquid storage tank 820. Further, storage control valve 825 is closed, and turbine flow control valve 700, as well as backup control valve 831 are in an open position, allowing all chilled liquid coolant to flow through coolant supply line 331 to heat exchanger(s) 330, and be returned via coolant return line 332 to chiller 810. A vent valve 843 is opened to allow liquid storage tank 820 to depressurize as the exhaust liquid or coolant 821' is returned into liquid storage tank 820. Note that in this embodiment, the liquid in liquid storage tank 820 may return to ambient temperature over a period of time. Note also in this regard, that liquid storage tank 820 may be located outdoors from computer room 801, or may be inside a common building housing computer room 801. Note that one power is restored, then as illustrated in FIG. 9C, motor coupling mechanism 600 is closed, coupling motor 405 to shaft 410, and turbine coupling mechanism 412 is opened, disengaging turbine 421 from shaft 410.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
an air-moving assembly, the air-moving assembly comprising:
a shaft;
one or more mechanical fans coupled to the shaft to rotate, at least in part, with the shaft facilitating, at least in part, air-cooling of an object; and
a motor coupled to the shaft to directly rotatably drive the shaft; and
an auxiliary turbine drive associated with the air-moving assembly, the auxiliary turbine drive coupling to the shaft of the air-moving assembly to provide backup rotational energy to the shaft to facilitate continued rotation of the shaft during interruption in power to the motor, wherein a liquid coolant facilitates, at least in part, cooling of air that cools the object, and the liquid coolant drives the auxiliary turbine device during the interruption in power to the motor.

2. The apparatus of claim 1, wherein the auxiliary turbine drive is sized to facilitate, for a specified period of time, the continued rotation of the shaft at a specified percentage speed of the shaft during the interruption in power to the motor compared with a rotational speed of the shaft when rotatably driven by the motor.

3. The apparatus of claim 2, further comprising a computer room, and wherein the object comprises one or more electronics racks, and the air-moving assembly comprises a computer-room, air-moving assembly providing, at least in part, air movement within the computer room, the computer room comprising the one or more electronics racks to be cooled, and the specified period of time is preselected to be a time interval from a utility power interruption to the motor within which utility or backup power is to be reestablished to the motor.

4. The apparatus of claim 1, further comprising a shaft extender to couple to the shaft to rotate therewith during the interruption in power to the motor, and a turbine coupling mechanism comprising a clutch coupling the shaft extender to the shaft during the interruption in power to the motor, wherein a turbine of the auxiliary turbine drive is coupled to the shaft extender, and couples to the shaft through the turbine coupling mechanism during the interruption in power to the motor.

5. The apparatus of claim 1, further comprising a computer room, and wherein the object comprises one or more electronics racks, and the air-moving assembly comprises a computer room air-conditioner (CRAC) unit, the computer room air-conditioner unit comprising an air-to-liquid heat exchanger that uses the liquid coolant and provides the cooled air to the computer room, the computer room comprising the one or more electronics racks to be cooled, and wherein the auxiliary turbine drive comprises a turbine coupled to provide the backup rotational energy to the shaft during the interruption in power to the motor.

6. The apparatus of claim 5, wherein the turbine of the auxiliary turbine drive is coupled in parallel-fluid communication with the air-to-liquid heat exchanger.

7. The apparatus of claim 5, wherein the turbine of the auxiliary turbine drive is coupled to at least one of receive the liquid coolant from or return the liquid coolant to a coolant supply line or a coolant return line providing the liquid coolant to the air-to-liquid heat exchanger of the air-moving assembly.

8. The apparatus of claim 1, wherein the auxiliary turbine drive further comprises a liquid supply tank comprising the liquid coolant, the liquid supply tank coupled to drive a turbine of the auxiliary turbine drive during the interruption in power to the motor.

9. The apparatus of claim 8, wherein the liquid supply tank comprises a liquid supply tower comprising the liquid coolant, the liquid coolant being fed in parallel to an air-to-liquid heat exchanger associated with the air-moving assembly, and to the turbine of the auxiliary turbine drive during the interruption in power to the motor.

10. The apparatus of claim 8, further comprising a liquid exhaust tank coupled to receive the liquid coolant exhausted from the turbine of the auxiliary turbine drive during the interruption in power to the motor.

11. The apparatus of claim 8, wherein the liquid supply tank further comprises a pressurizer for selectively pressurizing the liquid supply tank upon the interruption in power to the motor to facilitate an increased flow of the liquid coolant from the liquid supply tank to the turbine of the auxiliary turbine drive.

12. The apparatus of claim 1, further comprising an electromotive force (emf) decoupling mechanism coupled to a circuit line facilitating powering of the motor, the electromotive force (emf) decoupling mechanism automatically opening or decoupling with the interruption in power to the motor, and preventing the continued rotation of the shaft during the interruption in power to the motor from providing a back electromotive force through the motor.

13. The apparatus of claim 12, wherein the electromotive force decoupling mechanism comprises an electromagnetic switch, the electromagnetic switch being coupled to the circuit line, and automatically switching to an open circuit state with loss of the power to the motor through the circuit line.

14. The apparatus of claim 1, further comprising a motor decoupling mechanism, the motor decoupling mechanism comprising a clutch coupling the shaft to a drive shaft of the motor, the drive shaft driving rotation of the shaft when the motor is operating, and the clutch automatically decoupling the shaft from the drive shaft during interruption in power to the motor.

15. The apparatus of claim 1, further comprising a computer room, and wherein the object comprises one or more electronics racks, and the air-moving assembly comprises a computer-room air-conditioner (CRAC) unit, the computer-room air-conditioner unit comprising an air-to-liquid heat exchanger that uses the liquid coolant and provides the cooled air to the computer room, the computer room comprising the one or more electronics racks to be cooled, and wherein the auxiliary turbine drive provides, for the specified period of time, the continued rotation of the shaft to facilitate the computer-room air-conditioner unit providing additional of the cooled air to the data center during the interruption in power to the motor, and wherein the auxiliary turbine drive is coupled to the shaft to facilitate, for the specified period of time, the continued rotation of the shaft at a specified percentage, or greater, rotational speed of the shaft compared with a rotational speed of the shaft when rotatably driven by the motor.

16. A data center comprising:
   at least one electronics rack to be cooled; and
   an air-moving assembly, the air-moving assembly comprising:
      a shaft;
      one or more mechanical fans coupled to the shaft to rotate, at least in part, with the shaft facilitating, at least in part, air-cooling of the at least one electronics rack; and
      a motor coupled to the shaft to directly rotatably drive the shaft; and
   an auxiliary turbine drive associated with the air-moving assembly, the auxiliary turbine drive coupling to the shaft of the air-moving assembly to provide backup rotational energy to the shaft to facilitate continued rotation of the shaft during interruption in power to the motor to provide continued air-cooling to the at least one electronics rack during the interruption in power to the motor, wherein a liquid coolant facilitates, at least in part, cooling of air that cools the at least one electronics rack, and the liquid coolant drives the auxiliary turbine device during the interruption in power to the motor.

17. The data center of claim 16, wherein the auxiliary turbine drive is sized to facilitate, for a specified period of time, the continued rotation of the shaft at a specified percentage speed of the shaft during the interruption in power to the motor compared with a rotational speed of the shaft when rotatably driven by the motor.

18. The data center of claim 16, wherein the auxiliary turbine drive further comprises a liquid supply tank comprising the liquid coolant, the liquid supply tank coupled to drive a turbine of the auxiliary turbine drive during the interruption in power to the motor.

19. The data center of claim 18, wherein the liquid supply tank comprises a liquid supply tower comprising the liquid coolant, the liquid coolant being fed in parallel to an air-to-liquid heat exchanger associated with the air-moving assembly, and to the turbine of the auxiliary turbine drive during the interruption in power to the motor.

20. A method of facilitating cooling, the method comprising:

providing an air-moving assembly, the air-moving assembly comprising:
- a shaft;
- one or more mechanical fans coupled to the shaft to rotate, at least in part, with the shaft facilitating, at least in part, air-cooling of an object; and
- a motor coupled to the shaft to directly rotatably drive the shaft; and providing an auxiliary turbine drive associated with the air-moving assembly, the auxiliary turbine drive coupling to the shaft of the air-moving assembly to provide backup rotational energy to the shaft to facilitate continued rotation of the shaft during interruption in power to the motor, wherein a liquid coolant facilitates, at least in part, cooling of air that cools the object, and the liquid coolant drives the auxiliary turbine device during the interruption in power to the motor.

* * * * *